US 9,870,925 B1

(12) United States Patent
Feygenson

(10) Patent No.: US 9,870,925 B1
(45) Date of Patent: Jan. 16, 2018

(54) QUANTUM DOPING METHOD AND USE IN FABRICATION OF NANOSCALE ELECTRONIC DEVICES

(71) Applicant: Anatoly Feygenson, Hillsborough, NJ (US)

(72) Inventor: Anatoly Feygenson, Hillsborough, NJ (US)

(*) Notice: Subject to any disclaimer, the term of this patent is extended or adjusted under 35 U.S.C. 154(b) by 732 days.

(21) Appl. No.: 13/964,192

(22) Filed: Aug. 12, 2013

Related U.S. Application Data

(60) Provisional application No. 61/683,256, filed on Aug. 15, 2012.

(51) Int. Cl.
| | |
|---|---|
| *H01L 21/20* | (2006.01) |
| *H01L 21/36* | (2006.01) |
| *H01L 21/223* | (2006.01) |
| *H01L 29/36* | (2006.01) |
| *H01L 21/225* | (2006.01) |
| *H01L 29/15* | (2006.01) |
| *H01L 21/67* | (2006.01) |
| *H01L 21/02* | (2006.01) |
| *H01L 29/8605* | (2006.01) |

(Continued)

(52) U.S. Cl.
CPC .......... *H01L 21/223* (2013.01); *H01L 29/365* (2013.01); *H01L 21/02* (2013.01); *H01L 21/02422* (2013.01); *H01L 21/02543* (2013.01); *H01L 21/02557* (2013.01); *H01L 21/02565* (2013.01); *H01L 21/02584* (2013.01); *H01L 21/02631* (2013.01); *H01L 21/203* (2013.01); *H01L 21/2254* (2013.01); *H01L 21/3215* (2013.01); *H01L 21/32155* (2013.01); *H01L 21/67167* (2013.01); *H01L 21/67207* (2013.01); *H01L 29/157* (2013.01); *H01L 29/66* (2013.01); *H01L 29/7725* (2013.01); *H01L 29/8605* (2013.01)

(58) Field of Classification Search
CPC ............. H01L 29/02584; H01L 29/157; H01L 29/365; H01L 29/7725; H01L 29/8605; H01L 29/66; H01L 21/00; H01L 21/02; H01L 21/02422; H01L 21/02543; H01L 21/02557; H01L 21/02565; H01L 21/02631; H01L 21/203; H01L 21/2254; H01L 21/32155; H01L 21/67167; H01L 21/67207; H01L 21/3215; H01L 21/225; H01L 21/02584; H01L 21/223
USPC ..... 257/E29.111, E29.254, E29.11; 438/925, 438/508
See application file for complete search history.

(56) References Cited

U.S. PATENT DOCUMENTS

| | | | |
|---|---|---|---|
| 3,341,754 A | 9/1967 | Kellett et al. | |
| 5,527,733 A * | 6/1996 | Nishizawa et al. | 438/558 |

(Continued)

*Primary Examiner* — Teresa M Arroyo
(74) *Attorney, Agent, or Firm* — Wendy W. Koba

(57) ABSTRACT

A novel doping technology for semiconductor wafers has been developed, referred to as a "quantum doping" process that permits the deposition of only a fixed, controlled number of atoms in the form of a monolayer in a substitutional condition where only unterminated surface bonds react with the dopant, thus depositing only a number of atoms equal to the atomic surface density of the substrate material. This technique results in providing a "quantized" set of possible dopant concentration values that depend only on the additional number of layers of substrate material formed over the single layer of dopant atoms.

12 Claims, 22 Drawing Sheets

(51) Int. Cl.
  *H01L 29/772* (2006.01)
  *H01L 21/3215* (2006.01)
  *H01L 21/203* (2006.01)
  *H01L 29/66* (2006.01)

(56) References Cited

U.S. PATENT DOCUMENTS 6,872,626 B1 * 3/2005 Cheng .......................... 438/299
2007/0087581 A1 * 4/2007 Singh et al. .................. 438/780
2010/0167446 A1 * 7/2010 Nguyen et al. ................ 438/57

* cited by examiner

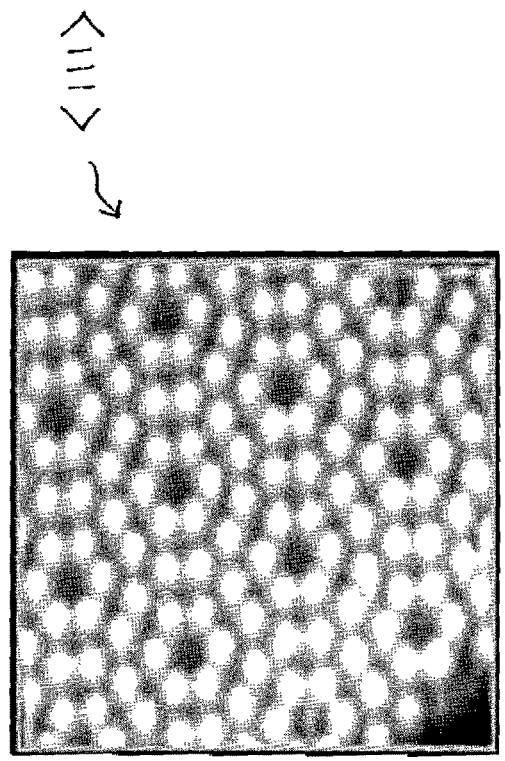
FIG. 1 ⟨111⟩
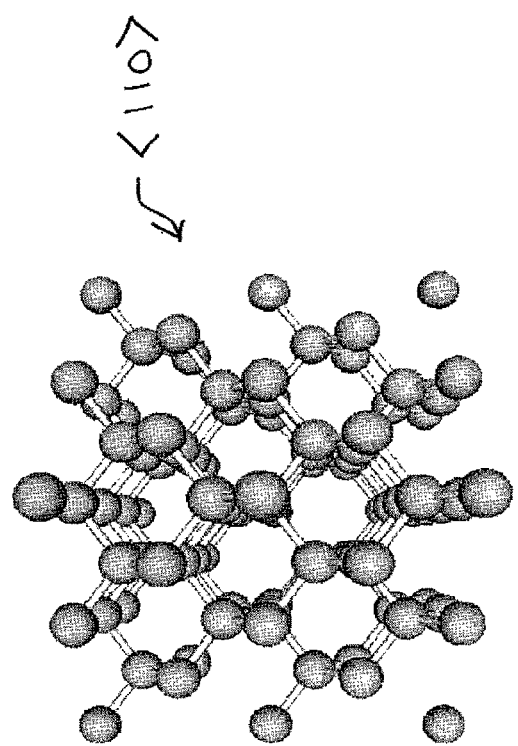
FIG. 2 ⟨110⟩

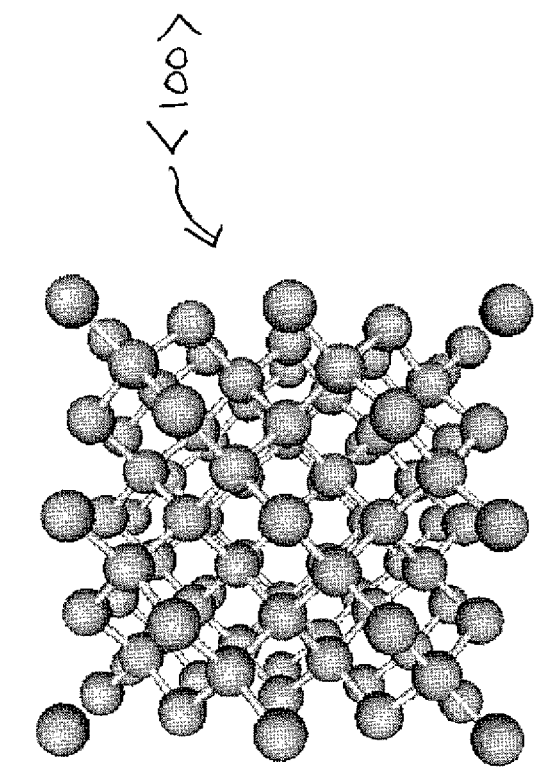
FIG. 3
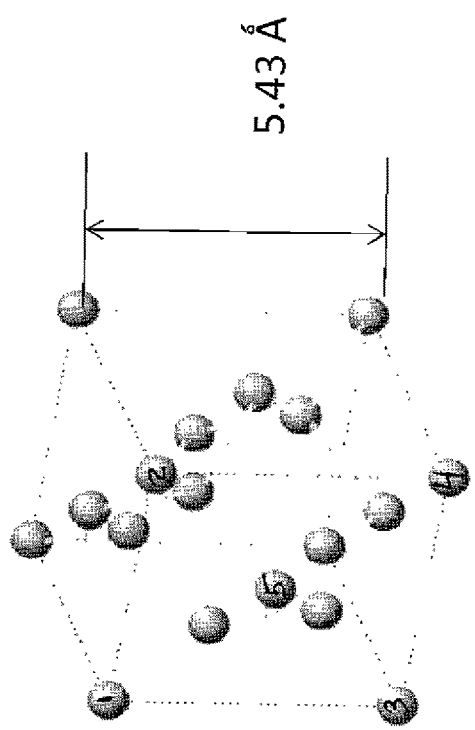
FIG. 4
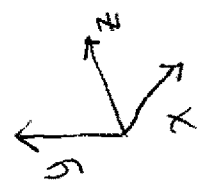

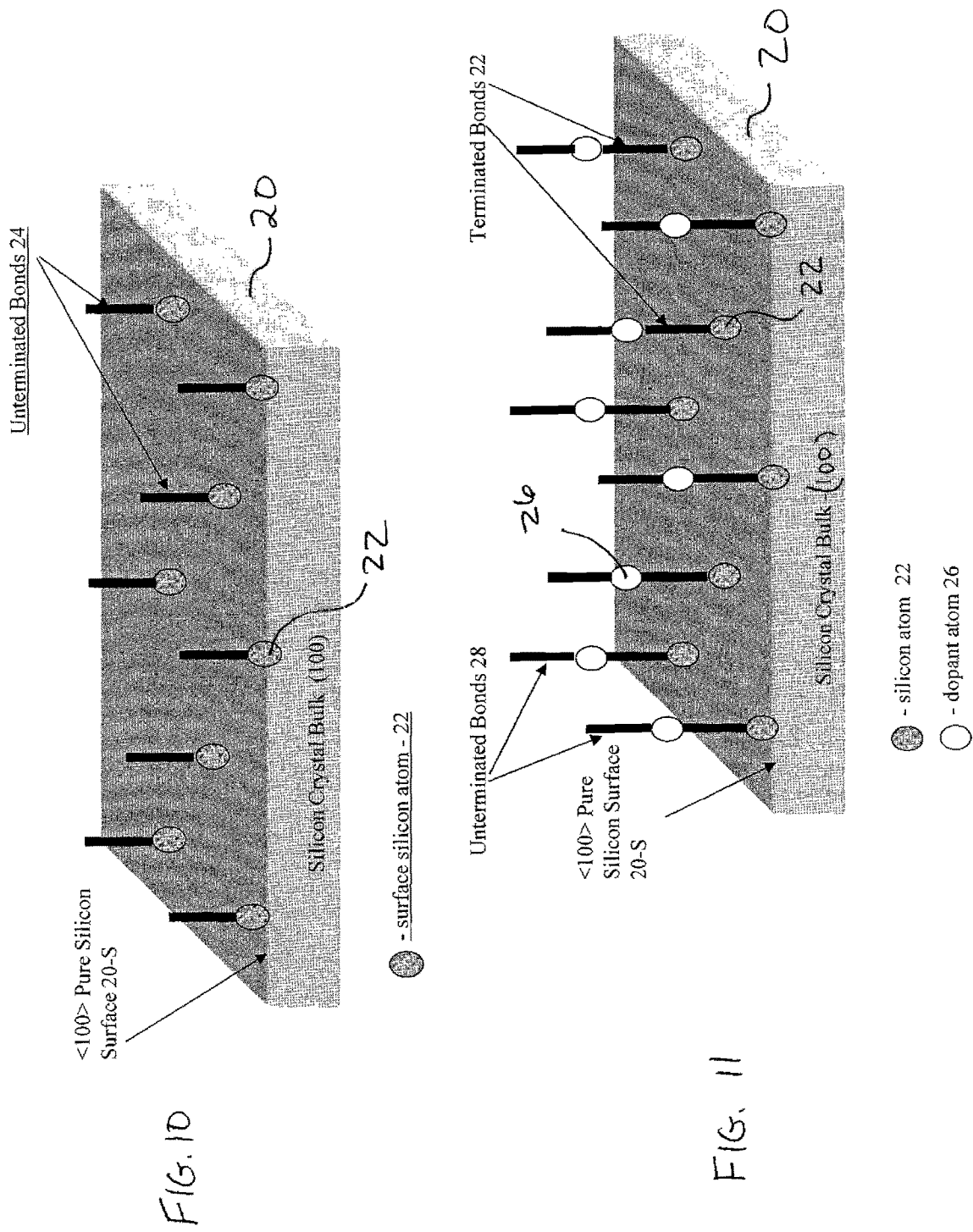

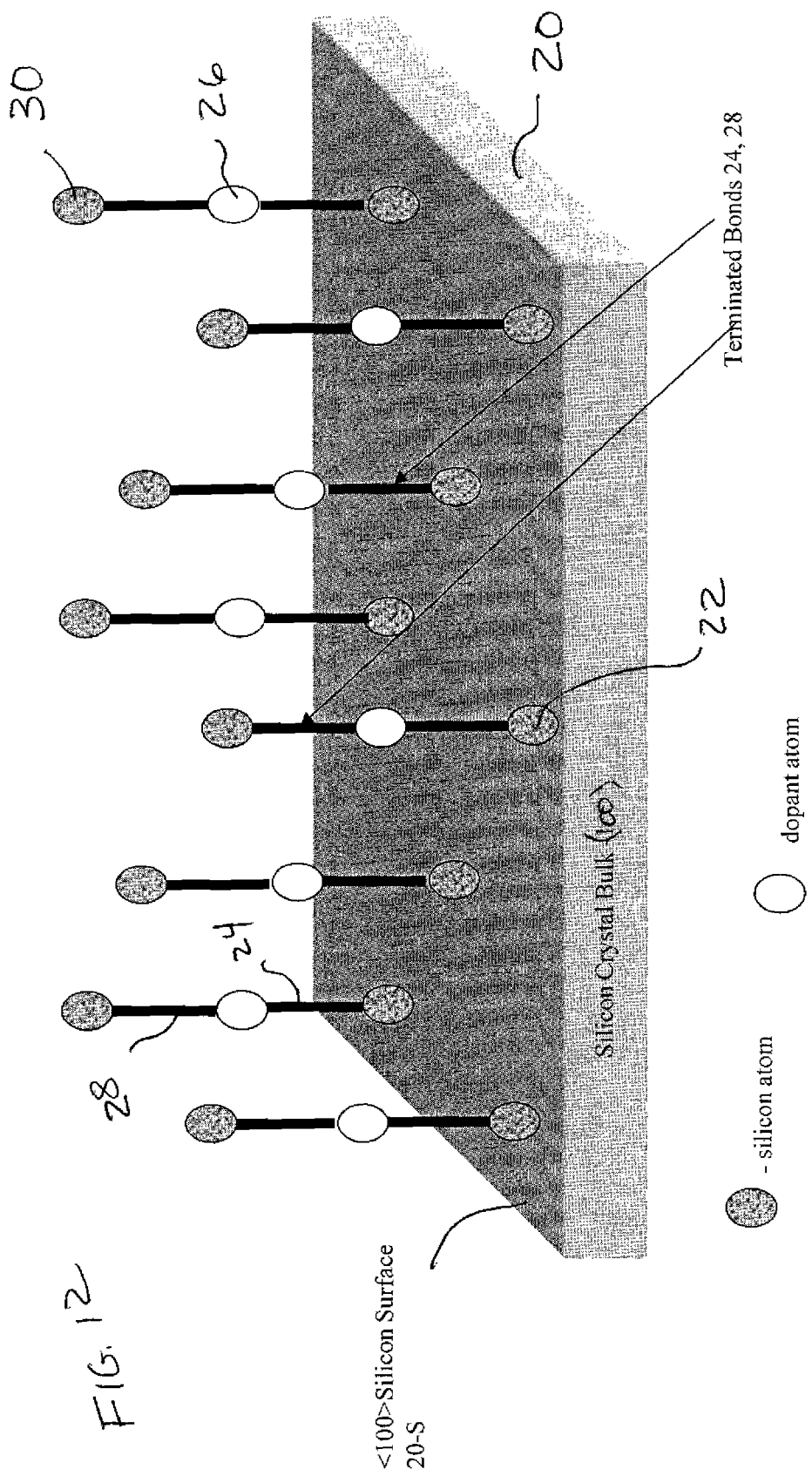

QUANTUM DOPING METHOD AND USE IN FABRICATION OF NANOSCALE ELECTRONIC DEVICES

CROSS-REFERENCE TO RELATED APPLICATIONS

This application claims the benefit of U.S. Provisional Application Ser. No. 61/683,256, filed Aug. 15, 2012 and herein incorporated by reference.

TECHNICAL FIELD

The present invention relates to a novel doping technology for semiconductor wafers and, more particularly, to the development of a "quantum doping" process that permits the deposition of only a fixed, control number of atoms in the form of a monolayer (i.e., a "quantized" set of possible dopant concentration values), which avoids the possibility of random dopant fluctuations in nanoscale devices (among other benefits).

BACKGROUND OF THE INVENTION

P-n junctions and, more generally, doping technology, play a quintessential role in semiconductor manufacturing. Forming a p-n junction oftentimes is achieved by doping a semiconductor with a suitable impurity; that is, intentionally introducing an impurity into an otherwise ultra-pure (intrinsic) semiconductor. Sometimes, an n-i or p-i junction is formed instead of a p-n junction (i meaning "intrinsic"), for use in specialized devices, such as detectors. The role of doping in semiconductor devices is to alter the electrical properties of the intrinsic semiconductor material in a pre-determined fashion, so as to achieve a particular functional device, such as a transistor.

There has been a steady stream of improvements to the doping process by means of introducing gaseous dopants into a diffusion furnace with precise temperature control. One such example is presented in U.S. Pat. No. 3,660,179 which utilizes a counter-flow of an inert gas within a diffusion furnace, with this flow then improving the uniformity of dopant concentration along the length of the diffusion carrier.

Today's common thermal diffusion practice relies on splitting the doping process into two parts. First, the requisite dopant materials are introduced onto a semiconductor wafer in a pre-deposition step. The dopant source may be in solid, liquid or gaseous form. Many different processes are well-known in the prior art for delivering the dopant atoms to the semiconductor wafer surface. The system temperature at this step is relatively low, so the dopants are predominantly located at or near the surface of the wafer. Next, a higher temperature process is employed (referred to as a "drive-in" process) to cause the dopants to diffuse further into the wafer (thermal diffusion). During the drive-in process, it is clear that only the dopants deposited during the first step are available to participate in the diffusion step—any dopant materials remaining in the diffusion furnace are lost to further processing. The selected higher temperature and the time length of the drive-in process will determine the final diffusion profile (i.e., the spatial distribution of the dopant in the semiconductor wafer).

There is one extremely important feature of thermal diffusion: as a result of thermodynamic considerations, all of the dopant atoms are become diffused into the bulk semiconductor wafer are located at substitutional sites. That is, all of the dopant atoms are electrically active and the dopant efficiency is 100%.

With the advent of semiconductor lithography, all semiconductors have shrunk in size. This reduction in size necessitated concomitant reductions in spacing between different regions of an exemplary device, including, for example, a reduction in p-n junction depth. It was thereafter discovered that a thermal diffusion process was not able to create shallow p-n junctions with a well-controlled dopant profile for smaller devices. The industry then switched to ion implantation as a preferred alternative for doping semiconductor material.

U.S. Pat. No. 3,341,754 discloses an exemplary ion implantation system, where a method of producing precision resistors with ions capable of moving into substitutional positions under the influence of heat is described. During ion implantation, ionized dopant atom ions are accelerated in an electric field to an energy sufficient to penetrate into a semiconductor wafer's bulk. When accelerated dopant atoms enter the semiconductor, they experience collisions and columbic interactions with the semiconductor's nuclei and electrons, transferring their momentum and energy until they come to a complete stop.

Depending on the energy and mass of an impinging ion, the semiconductor's crystal structure can be damaged (or even destroyed) by the energetic collisions. This situation necessitates the utilization of a post-implantation annealing step. During the anneal, the temperature of the semiconductor is raised to a high temperature for a period of time sufficient to move implanted dopant atoms from their initial interstitial positions into substitutional positions, thus making the dopant electrically active. As a consequence of the non-equilibrium nature of the ion implantation process, not all of the post-anneal implanted dopants will move into substitutional sites. Thus, dopant efficiency of the ion implantation process is always less than 100%. In fact, the dopant atoms that remain in interstitial positions create permanent residual damage, negatively impacting the resulting semiconductor device performance in terms of carrier mobility, increased junction leakage and reduced breakdown voltage.

Even in light of these problems, ion implantation-based doping remained as a mainstay of the semiconductor industry for several decades, until the continued device scaling reduced the gate length of MOS devices to a value less than 100 nm. Currently, random dopant fluctuation (RDF), related to ion implantation variances, remains problematic. In MOSFET devices, RDF in the channel region can alter the transistor's properties, especially in newer process technologies since the total number of dopants is fewer. Thus, the addition or deletion of just a few impurity atoms can significantly alter transistor properties. RDF is a local form of process variation, meaning that two juxtaposed transistors may have significantly different dopant concentrations.

As will be discussed below, the present invention will address this problem with using a rapid thermal epitaxy (RTE) process. In order to understand the various processes developed over time, as well as their relation to the subject matter of the present invention, selected ones of the processes will first be described, starting with chemical vapor deposition (CVD), which is the most generic term used in the field of integrated circuit fabrication.

CVD is a chemical process used to produce solid materials—in most cases, thin films on formed on various substrates. In a typical CVD process, the substrate is exposed to volatile precursors, which react and/or decompose on the substrate surface to produce the desired film. Volatile by-products are also produced, which are removed by gas flow through the reaction chamber.

Epitaxy, a variant of the CVD process, is commonly defined as a deposition of a crystalline film on a crystalline substrate, where the film forms in registration with the crystallographic orientation of the substrate. The term epitaxy comes from the Greek roots epi, which means "above", and taxis, which means "in an ordered manner". The term "epitaxy" can also be translated to mean "to arrange upon". As used in the case of semiconductor processing, an epitaxial film will form only a single, well-defined orientation with respect to the substrate crystal structure (single-domain epitaxy).

Epitaxial films can be grown from gaseous or liquid precursors. Since the substrate act as a "seed" crystal, the deposited film will lock into one or more of the crystallographic orientations of the substrate crystal. If an epitaxial film is deposited on a substrate of the same composition, the process is defined as "homo-epitaxy", otherwise, it referred to as "hetero-epitaxy". Traditional epitaxial processes tend to have high growth rates, and can approach 1 µm/min or more.

When slower growth (and/or better thickness control) is required, a process referred to as "atomic layer chemical vapor deposition" (ALCVD) or simply "atomic layer deposition" (ALD) is used. Also referred to at times as "atomic layer epitaxy" (ALE), this atomic-based process enables the deposition of alternating mono-layers of two elements onto a substrate (see, for example, U.S. Pat. No. 4,058,430). In this case, the achieved crystal lattice structure of the deposited film is thin, uniform and aligned with the structure of the substrate. In use, the reactants are brought to the substrate as alternating pulses, with "dead" time between the two different reactants. ALE makes use of the fact that the incoming material is strongly bound to the surface of the substrate until all of the sites available for chemisorptions are occupied. The dead time is used to flush an excess material from the reaction chamber. A main requirement of an atomic layer process is the use of a self-limiting chemical reaction as the means of achieving very accurate thickness control of the resulting film.

As the chemical reactants are alternately pulses, they will chemisorb onto the surface of the substrate to form the monolayer. Typically, one of the precursors will adsorb onto the substrate surface until it saturates the surface; further growth cannot occur until the second precursor is introduced. Therefore, the thickness of the film is controlled by the number of precursor cycles, rather than the deposition time (as is the case for conventional CVD processes). Cited limitations of atomic-based processes include slow growth rate, lack of selectivity ("selectivity" being the ability of film deposition only in areas defined by a mask) and limited film compositions (limited by the availability of suitable precursors).

Another variant of CVD is rapid thermal CVD (RTCVD), which takes advantage of rapid thermal processing to improve the efficiency of conventional CVD techniques. U.S. Pat. No. 5,002,630 describes an exemplary RTCVD process. During RTCVD, a semiconductor wafer is placed into a reaction chamber, which is thermally isolated from the wafer. The wafer is rapidly heated to a reaction temperature, which a reactant gas flowing over the wafer to induce reaction at the heated surface of the wafer. The wafer is then cooled and removed from the chamber, ready for further processing.

The RTCVD of single crystal silicon films on a silicon wafer is accomplished by using dichlorosilane as the source of silicon (carried by hydrogen). Hydrogen is mixed with argon or other inert gas. The process is carried out at temperatures of the silicon substrate above 750° C., and at a pressure no greater than atmospheric pressure. The single crystal silicon layer can be in-situ doped n-type or p-type to provide the required resistivity for the fabrication of integrated circuits.

Gas phase doping of semiconductor material in a cold-wall radiantly heated reactor maintained under a reduced pressure (as described in, for example, U.S. Pat. No. 5,324,684). In this process, doping of a silicon substrate uses gas phase dopant sources that are maintained under reduced pressure. The silicon substrate is placed on a thermally isolated support structure in the chamber, allowing the temperature of the substrate to elevate via radiant heating. Once a defined, controlled temperature is reached, a gas phase source of the dopant is flowed across the substrate, where it is then absorbed. As with some other prior processes, an anneal step is used after dopant introduction.

SUMMARY OF THE INVENTION

The needs remaining in the prior art are addressed by the present invention, which relates to a novel doping technology for semiconductor wafers and, more particularly, to the development of a "quantum doping" process that permits the deposition of only a fixed, controlled number of atoms in the form of a monolayer (i.e., a "quantized" set of possible dopant concentration values), which avoids the possibility of random dopant fluctuations in nanoscale devices (among other benefits).

In accordance with the present invention, a doping method has been developed that is based on the atomic surface density of single crystal semiconductors. The method is preferably facilitated through the use of rapid thermal epitaxy (either non-selective or selective) that is conducted in a self-limiting chemical reaction mode. The inventive method takes advantage of the finite and constant atomic surface density, which only varies with crystallographic orientation and type of semiconductor material. Therefore, for a given type of semiconductor material with a certain crystallographic orientation, the doping density will be "quantized"; that is, the atomic surface density will always be a finite, fixed value.

Quantization of the doping density, therefore, will only be a function of this atomic surface density and the number of grown monolayers (undoped/doped). Doping densities in excess of published solid solubility data for all common dopants in silicon can also be achieved.

In accordance with the quantization principles of the present invention, the possibility of random dopant fluctuations is eliminated, allowing for superior control over transistor characteristics (e.g., threshold voltage, channel mobility). As a result, nanoscale-sized devices can be fabricated with better quality control than previously possible, offering the ability to lower supply voltage levels and increase the total number of transistors per chip (as the result of reduced power consumption). Additionally, this new doping method opens up multiple applications, ranging from precision p-n junction formation to channel-engineered "junction-less" and junction MOS transistors and power transistors.

One particular embodiment of the present invention comprises a method of performing controlled doping of a semiconductor material including the steps of: a) providing a substrate of a semiconductor material of a predetermined crystallographic orientation and having a top major surface; b) atomically cleaning the top major surface of the substrate to remove impurities and expose only unterminated bonds of surface atoms, creating a surface with an atomic surface density defined by the crystallographic orientation; c) introducing gas precursors of a dopant material at a relatively low temperature, suspending further processing until thermal equilibrium is obtained; d) rapidly elevating a temperature within the reaction chamber to a level sufficient to cause atoms of the dopant material to chemisorb with the top surface of the semiconductor material and bond to the unterminated bonds in a substitutional bonding formation in a self-limiting deposition process, creating a single layer of dopant atoms of the same atomic surface density and leaving unterminated dopant bonds at the surface thereof; e) purging the reaction chamber of gas precursor effluent; f) introducing gas precursors of substrate material at a relatively low temperature, suspending further processing until thermal equilibrium is obtained; g) rapidly elevating a temperature within the reaction chamber to a level sufficient to cause atoms of the substrate material to bond to the unterminated dopant bonds in a substitutional bonding formation in a self-limiting deposition process, creating a layer of semiconductor atoms with the same atomic surface density; and h) repeating steps e) through g) to continue to deposit additional atomic layers of substrate material sufficient to create a predetermined dopant density, defined by the atomic surface density and the number N of additional atomic layers of substrate material.

Another embodiment of the present invention can be described as a semiconductor device including a substrate formed of a semiconductor material having a predetermined crystallographic orientation and a surface layer of atoms with unterminated bonds, the surface layer of atoms having an atomic surface density defined by the predetermined crystallographic orientation, a single atomic layer of atoms of a dopant material deposited over the surface layer in a self-limiting process that will terminate all unterminated bonds and create a layer of dopant atoms of the same atomic surface density and a plurality of N atomic layers deposited over the single atomic layer of atoms of dopant material, the value of N selected to create a predetermined dopant density, where the dopant density is equal to N*(atomic surface density).

Other and further advantages and aspects of the present invention will become apparent during the course of the following discussion and by reference to the accompanying drawings.

BRIEF DESCRIPTION OF THE DRAWINGS

Referring now to the drawings, where like numerals represent like parts in several views:

FIG. 1 is a created image of a silicon crystal surface along the <111> crystallographic plane;

FIG. 2 is an artist's rendition of a silicon crystal as seen along the <110> direction;

FIG. 3 is an artist's rendition of a silicon crystal as seen along the <100> orientation;

FIG. 4 illustrates an exemplary silicon unit cell;

FIG. 10 illustrates an exemplary silicon substrate at the completion of an initial step in the process outlined in FIG. 9;

FIG. 11 illustrates a subsequent step in the process as outlined in FIG. 9, showing the results of performing a self-limiting deposition to terminate each surface bonds 24 with an appropriate dopant atom;

FIG. 12 illustrates a following step in the process of FIG. 9, involving the performance of a self-limiting reaction to terminate dopant bonds with a monolayer of silicon atoms;

DETAILED DESCRIPTION, INCLUDING ILLUSTRATED EXAMPLES

Figure 5:
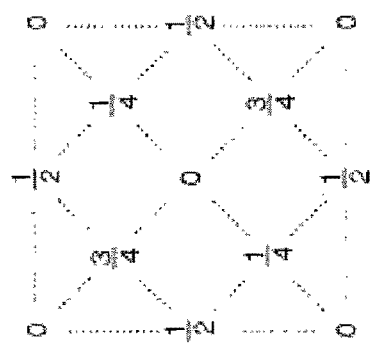
FIG. 5 is a variation of the silicon unit cell as shown in FIG. 4, with each face of the FIG. 5 structure containing five separate silicon atoms.

In the following description, numerous specific details are set forth, such as particular structures, components, materials, dimensions, processing steps and techniques, in order to provide a thorough understanding of the present invention. However, it will be appreciated by those skilled in the art that the invention may be practiced without these specific details. In other instances, well-known structures or processing steps have not been described in detail in order to avoid obscuring the subject matter of the present invention. For example, the term "silicon crystal bulk substrate" can also mean a silicon-on-insulator (SOI) structure, since the choice of using silicon crystal or an SOI material as a starting substrate does not change the proposed doping method.

Additionally, the specific number of monolayers shown in the drawings is for illustrative purposes only. The actual number of layers and their structure will ultimately be determined by the desired device characteristics. Various ones of the structures described below include a "gate oxide" layer. It is to be understood that various, well-known processes can be used to form a gate layer and will not be described here.

It should further be noted that while rapid thermal epitaxy (RTE) is highlighted as a preferred method of forming a quantum-doped device in accordance with the present invention, it is only one of many methods that may be utilized to deposit "atomic" layers on a silicon substrate structure. The important property for the purposes of the present invention is the ability to provide a "reagent-limited reaction" (i.e., a "self-limiting reaction"). As will be explained in detail below, the quantum doping process depends on the fact that dopant atoms chemisorb (or react) with the silicon surface atoms, resulting in the formation of the saturated chemisorbed layer that makes any further adsorption impossible. Under these reaction conditions, the film growth (i.e., deposition) is thus defined as self-limiting; that is, the amount of film that is deposited is a constant. In addition, the amount of reacting gases is so limited as to form just a single monolayer of atoms (silicon, dopant or the like).

FIG. 1 is a created image of a silicon crystal surface along the <111> crystallographic plane, as observed via a scanning tunneling microscope (STM). STM utilizes tunneling phenomenon, which occurs when a probe having a sharp, conducting tip is brought very near to the silicon surface, with a bias voltage applied between the tip and the silicon surface. This phenomenon allows for the electrons to tunnel (i.e., "jump") from the silicon surface to the tip of the probe. The current is measured and reproduced in a two-dimensional plot (X-Y) to create the image. The STM's resolution is typically around 1.0 Å in the X (horizontal) direction and about 0.1 Å in the Y (vertical) direction. This amazing resolution enables imaging of the surface of individual atoms. The specific image as shown in FIG. 1 confirms a long-standing knowledge of crystalline silicon structure that had earlier been developed via Bragg's diffraction-based crystallography. Silicon, just like germanium and carbon, exhibits a diamond cubic crystal structure and has a lattice constant of 5.43 Å.

FIG. 2 is an artist's rendition of a silicon crystal as seen along the <110> direction. In comparison with the <111> orientation of FIG. 1, it is clear that the <100> direction is less dense, with fewer atoms at the surface. This property (that is, the number of atoms at the surface) is an important parameter that is used in the quantum doping process of the present invention, as will be described in detail below.

The remaining orientation of a silicon crystal is illustrated in FIG. 3, in this case being an artist's rendition of a silicon crystal as seen along the <100> orientation, which exhibits yet a different number of atoms at the surface of the crystal.

FIG. 4 illustrates an exemplary silicon unit cell. As is well-known in the art, a unit cell will produce an entire crystal when translated in the X, Y and Z directions. As mentioned above, silicon possesses what is referred to as a "diamond cubic" crystal structure, with a lattice spacing of 5.43 Å. As evident in FIG. 4, each "face" of the cube contains five separate silicon atoms.

FIG. 5 is a variation of the silicon unit cell as shown in FIG. 4. As with the FIG. 4 illustration, each face of the FIG. 5 structure contains five separate silicon atoms (indicated by the locations having the numeral "0"). Here, other atoms are depicted as being below the surface of these five atoms, where the different numeric values in the circles indicate the height of the atom below the top of the cube, as a fraction of the cell's dimension of 5.43 Å.

Figure 6:
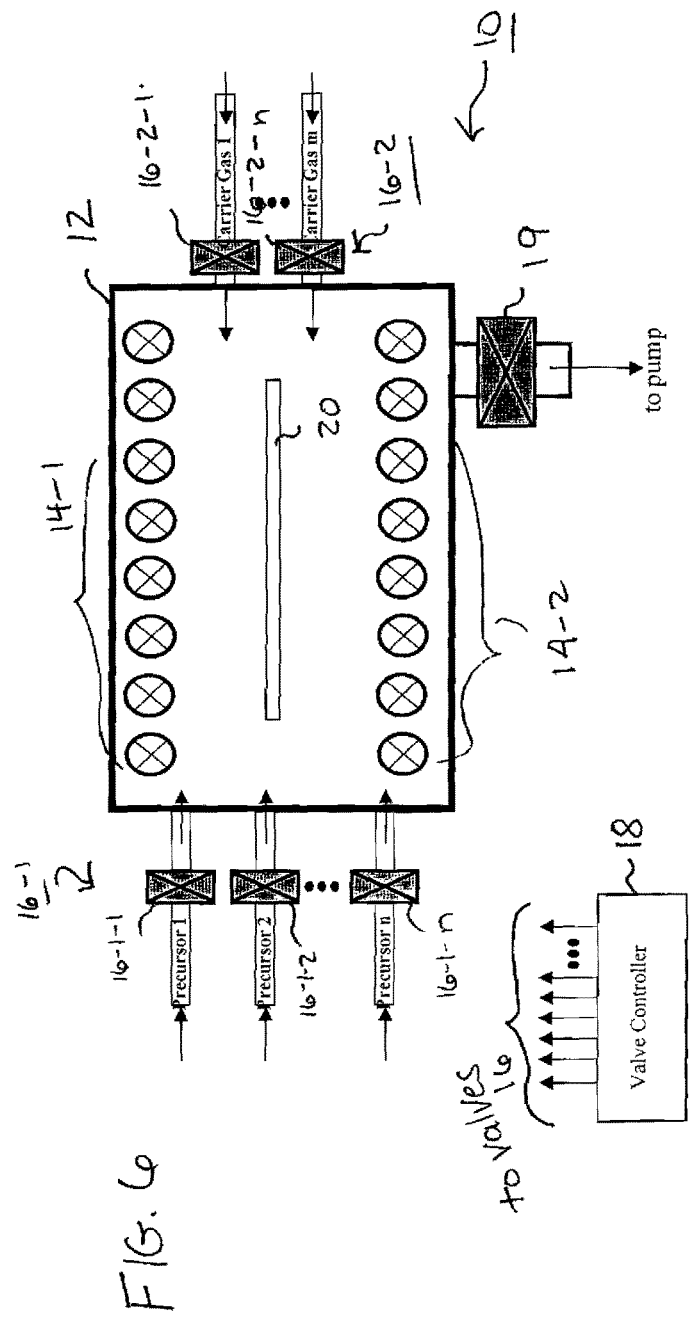
FIG. 6 illustrates an exemplary apparatus for performing rapid thermal epitaxy (RTE), as may be used in forming semiconductor structures in accordance with the present invention.

As mentioned above, the quantum doping process of the present invention is preferably practiced using a rapid thermal epitaxy (RTE) process. FIG. 6 illustrates an exemplary apparatus 10 for performing RTE. Apparatus 10 comprises a processing chamber 12 that includes a plurality of heat sources 14 (e.g., lamps), where a first set of heat sources 14-1 is positioned above a semiconductor wafer being processed (shown as wafer 20 in FIG. 6) and a second set of heat sources 14-2 is positioned below semiconductor wafer 20.

A first plurality of valves 16-1 are separately controlled to introduce various precursors to chamber 12, and a second plurality of valves 16-2 are separately controlled to introduce various carrier gases to chamber 12. A separate valve controller 18 provides the separate signals to control the actuation of each valve 16. Valve controller 18 is generally a computer-controlled arrangement. A separate valve 19 is coupled to chamber 12 and used to evacuate all effluent from the chamber (as pulled out via a vacuum pump source, not shown).

Figure 7:
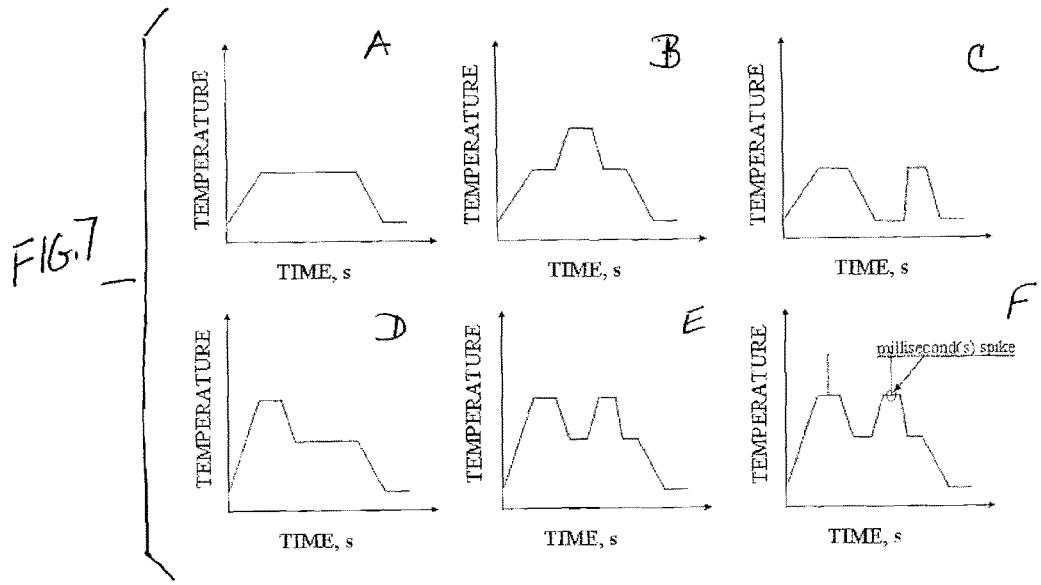
FIG. 7 contains plots of various temperature profiles that may be generated within the apparatus of FIG. 6 during an exemplary RTE deposition process.

FIG. 7 contains plots of various temperature profiles that may be generated within chamber 12 via heat sources 14 during the various steps associated with an exemplary RTE process, as performed in apparatus 10 shown in FIG. 6. Profile A, for example, can be utilized in the beginning of a process, when producing an "atomically clean" surface is required. Profile B may be used in performing deposition of alternating silicon monolayers. Profile C may be used in depositing alternating silicon and carbide monolayers. Profile D may be used to introduce a single-dopant monolayer and profile E when more than one type of dopant is being introduced. Profile F may be used when a "selective" deposition process is required.

It should be understood that the temperature profiles as shown in B-E are periodic as a function of time, and are active during the formation of at least one (but no more than two) monolayers. For "bulk" deposition (in this case, more than two monolayers), only the temperature profile identified as Profile A is appropriate, since it is not periodic as a function of time. It should also be noted that any combination of these profiles can be used during RTE, depending on the choice of bulk gases, precursors, material composition and doping requirements.

Figure 8:
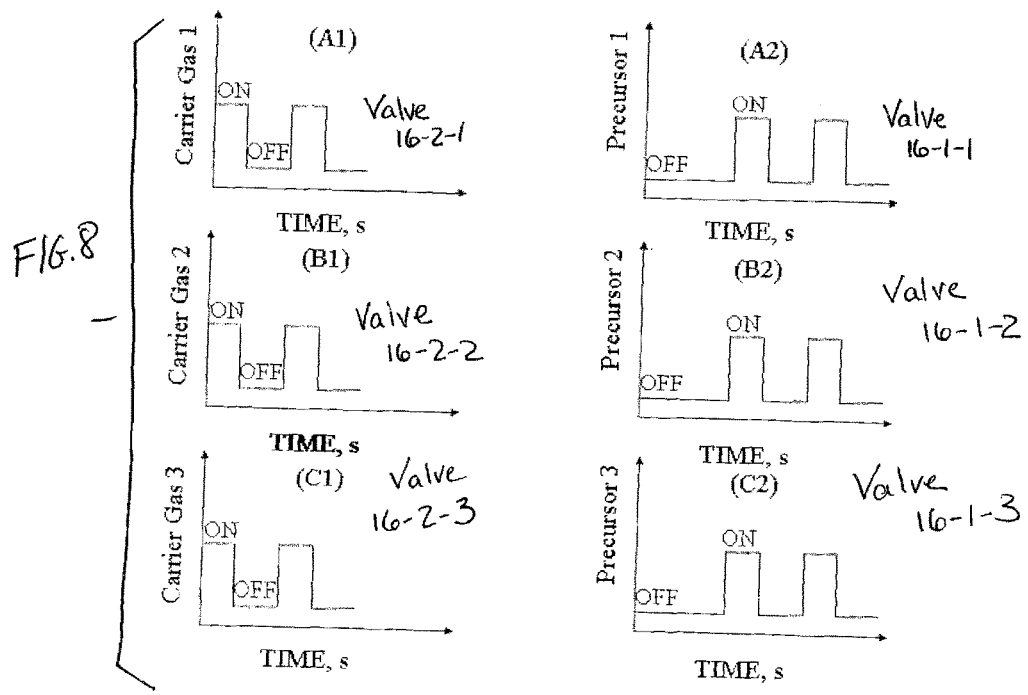
FIG. 8 contains one exemplary set of control signals that may be used to control valve settings in the chamber of FIG. 6 during an exemplary RTE deposition process.

With reference to FIG. 6, FIG. 8 contains one exemplary set of control signals that may be used to control valve set 16-1 and valve set 16-2. In one example, a process may start by introducing a first carrier gas (Gas 1 in FIG. 6) into chamber 12, controlled via signal A1 as applied to valve 16-2-1. A first precursor (Precursor 1 in FIG. 6) is then introduced, as controlled via signal A2 as applied to valve 16-1-1, to prepare an atomically clean surface. An introduction of a second carrier gas (Gas 2) follows to flush out Precursor 1, with this shown in FIG. 8 as control signal B2 applied to valve 16-2-2.

At this point, Precursor 2 may be introduced (control signal B2 applied to valve 16-1-2) to facilitate single layer silicon deposition. Following this, Gas 3 is used to flush out Precursor 2. Control signal C1 illustrates the signal applied to valve 16-2-3 which controls the introduction of Gas 3. Lastly, Precursor 3 is introduced (via signal C2 applied to valve 16-1-3) to facilitate the formation of a quantum doping monolayer.

Going forward, the valve control signals are used to cycle in the following order: Gas 2; Precursor 2; Gas 3; Precursor 3 until the predetermined number of cycles has been completed. The specific valve sequencing depends on properties of the material to be deposited, doping and material composition. Regardless, valve sequencing is configured to produce a single monolayer, and there can be many precursors and carrier gases used in the inventive process.

Figure 9:
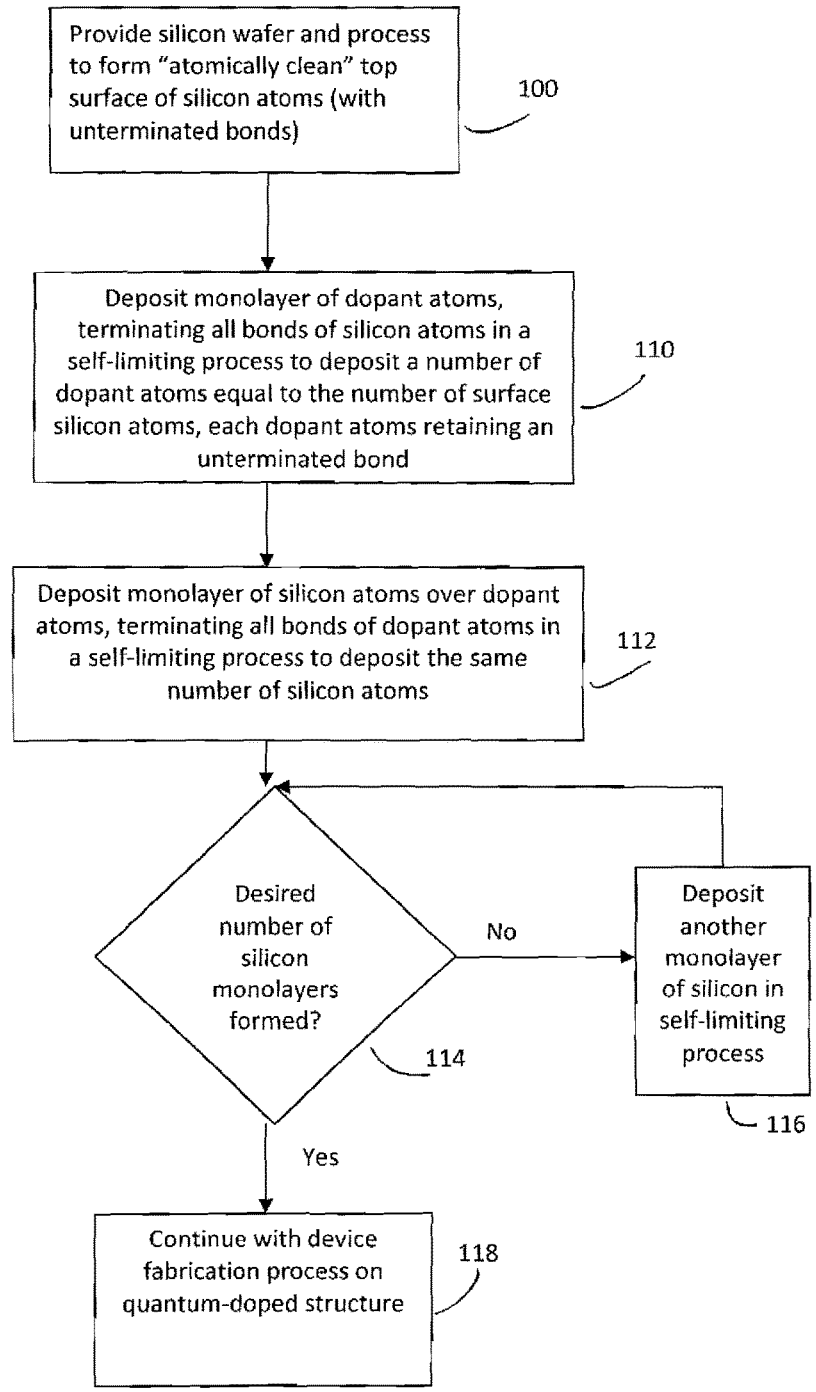
FIG. 9 is a flowchart illustrating an exemplary process of using quantum doping in device formation in accordance with the present invention.

A flowchart illustrating an exemplary process of using quantum doping in device formation, in association with the details of FIGS. 6-8, is shown in FIG. 9. In particular, the exemplary process begins at step 100 with the provision of a silicon crystal bulk wafer (of a given orientation) that is processed to exhibit an "atomically clean" surface. This surface, as will be described in detail below consists of a known number of silicon atoms, each having a remaining, unterminated bond.

The process continues at step 110 with the deposition of a monolayer of dopant atoms, where each dopant atom with attach to one of the unterminated bonds, creating a structure where the number of deposited dopant atoms is exactly equal to the number of surface silicon atoms (that is, the dopant atoms chemisorb with the surface silicon atoms to create a saturated layer). Following this step, a "capping" monolayer of silicon atoms is deposited over the dopant atoms (shown as step 112 in FIG. 9). At this point, a decision is made (shown as step 114) to determine if the film being formed is of the desired thickness (that is, have a sufficient number of silicon monolayers been deposited). If the answer is "no", the process continues with the deposit of another monolayer of silicon atoms (step 116). Another assessment is made at decision step 114, where the process will continue to cycle between steps 114 and 116 until an appropriate number of silicon monolayers has been deposited. At that point, the process moves to step 118, which continues with whatever additional fabrication processes are required to form a final device structure.

FIG. 10 illustrates an exemplary silicon substrate at the completion of step 100 of the above-described process, the formation of an atomically-clean surface. It is well known that the surface of a silicon wafer (such as wafer 20 shown in FIG. 10) is highly reactive and under normal conditions will be covered with oxygen, nitrogen and/or other elements that have contacted wafer 20 during storage, transport, and/or other environmental conditions. As described above, step 100 of the inventive process involves cleaning surface 20-S of wafer 20 with a reactive gas, such as gaseous HF. The cleaning is facilitated by establishing a requisite temperature inside the chamber where wafer 20 is located (such as chamber 12 described above) and exposing the heated wafer to the reactive gas for a period of time sufficient to remove all surface contaminants. The resulting atomically clean structure, as shown in FIG. 10, will then include a plurality of silicon surface atoms 22, along with their unterminated bonds 24.

The next step in the process (defined as step 110) is shown in FIG. 11 and is the performance of a self-limiting reaction to terminate bonds 24 with an appropriate dopant (either n-type or p-type) in the form of a monolayer of dopant atoms 26. As a result, atomically pure silicon wafer surface 20-S will be covered with a monolayer of dopant atoms 26 that terminate each and every bond 24. As shown in FIG. 11, each dopant atom 26 also has an unterminated bond, shown as 28 in FIG. 11. At the end of step 110, a single monolayer of dopant (represented by atoms 26) has been formed.

Subsequent to the formation of this first monolayer, the next step in the process (step 112), as shown in FIG. 12, involves the performance of a self-limiting reaction to terminate bonds 28 with a monolayer of silicon atoms 30. As shown, the individual silicon atoms 30 aligning with individual unterminated bonds of dopant atoms 26 in a one-to-one relationship. At this point, the structure now has a "new" atomically clean surface 30-S and includes just a single monolayer of dopant and a single monolayer of silicon.

If it is desired to add more layers of silicon to the structure (a decision made at step 114 in the process shown in FIG. 9), then the process as associated with temperature profile A is used, and a continuous deposition of silicon monolayers can be performed until the desired bulk density is achieved.

Table I, below, illustrates various properties of silicon that are relevant to the process described above:

TABLE I

| | Orientation | | |
| --- | --- | --- | --- |
| | (100) | (110) | (111) |
| Atomic density, $10^{14}/cm^2$ | 6.78 | 9.59 | 15.66 |
| Spacing, Å | 5.43 | 3.84 | 3.13 |
| Surface energy, $J/cm^2$ | 2.13 | 1.51 | 1.23 |

As shown, the atomic surface density is highest for (111) silicon and lowest for (100) silicon. The atomic spacing shows that the (100) is least packed, and the (111) direction is highly packed. Higher surface energy for the (100) silicon orientation means that it exhibits weaker binding at the surface, as compared to the (111) surface binding. With this information in mind, some of the details of step 112 as described above can be studied in detail.

Figure 13:
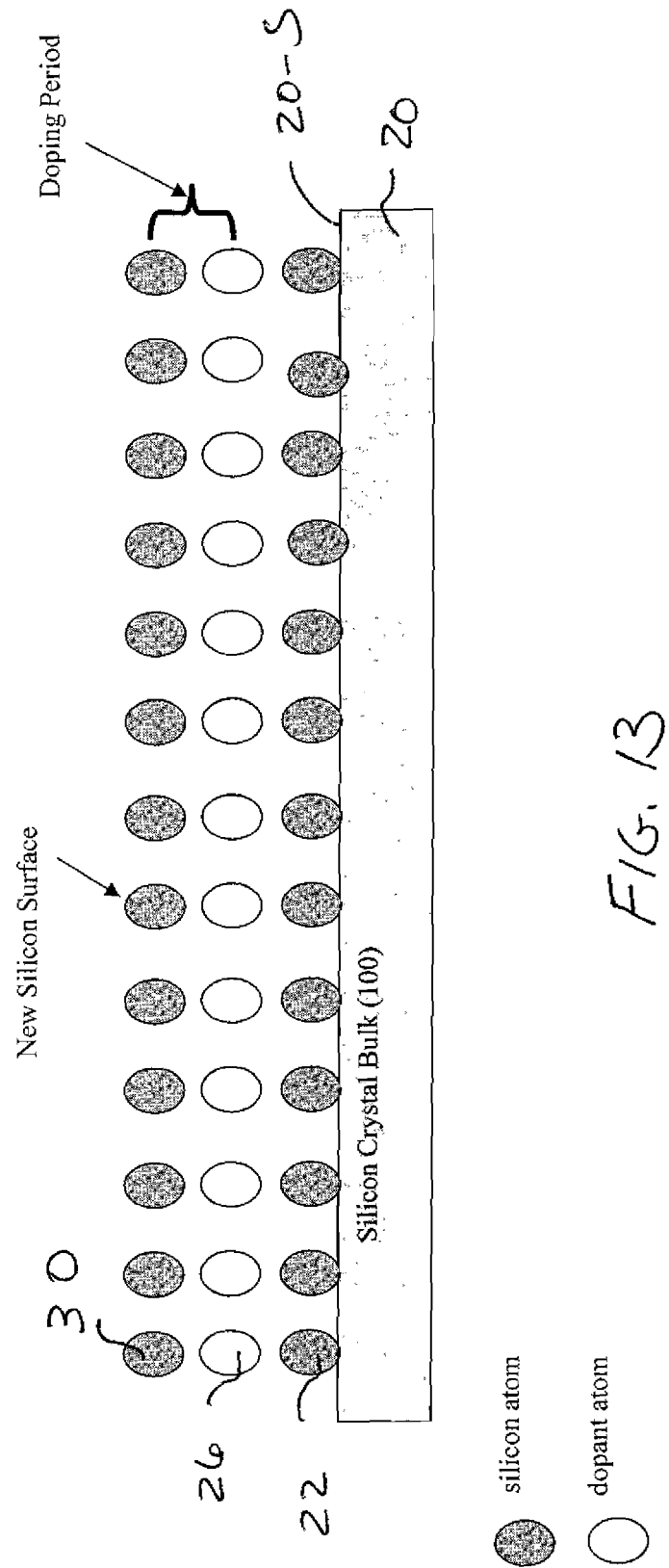
FIG. 13 is a two-dimensional representation of the arrangement of FIG. 12, showing the presence of a single "capping" monolayer of silicon atoms over the dopant bonds.

FIG. 13 is a two-dimensional representation of the arrangement of FIG. 12, showing the presence of a single "capping" monolayer of silicon atoms 30, disposed over a single monolayer of dopant atoms 26. For the purposes of discussion, silicon wafer 20 is presumed to be of (100) orientation. In this case, the number of dopant atoms 26 will equal the number of silicon atoms 22 present at the initial surface, with a density value of $6.78*10^{14}$ atoms/$cm^2$. With reference to Table I, the lattice spacing is shown to be 5.43 Å. Therefore, the volume doping density for this "single doping layer" structure equals the density divided by the spacing; in this case, having a value of $1.25*10^{22}$ atoms/$cm^3$. This would be the highest achievable doping density for (100) silicon.

In accordance with the present invention, it is clear that the doping density is "quantized" (i.e., fixed), as opposed to being any possible continuous value (as possible, for example, with ion implantation where virtually any doping density can be created). As mentioned above, however, at least one problem with this prior art "continuous" type of dopant density creation is that it opens the possibility for random density fluctuations (RDF). In contrast, by utilizing a "discrete" process in accordance with the present invention, where the doping density can only take on specific, "quantized" values, the possibility of introduced RDF is eliminated.

Figure 14:
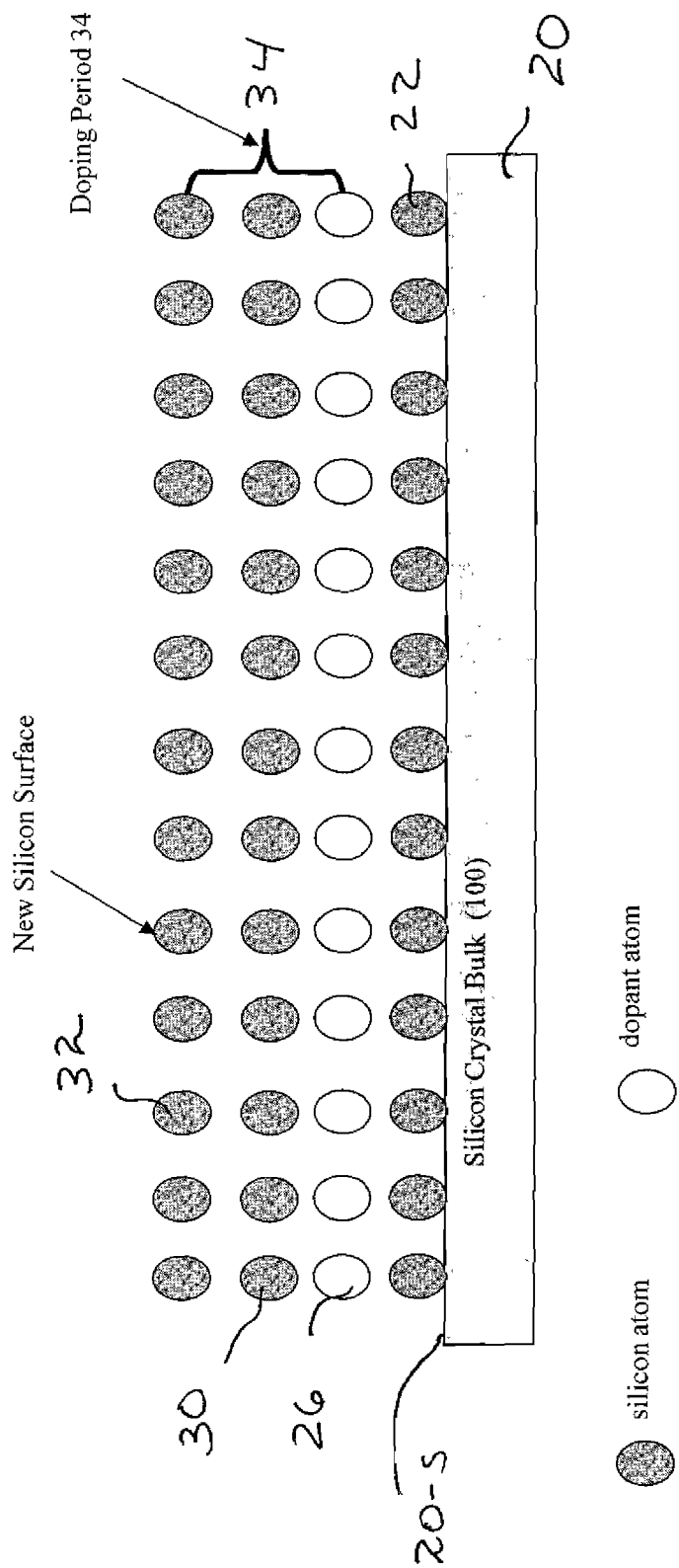
FIG. 14 illustrates an extension of the embodiment as shown in FIGS. 12 and 13, in this case adding a second layer of silicon atoms as another "capping" layer.

FIG. 14 illustrates an extension of the embodiment as shown in FIGS. 12 and 13, in this case adding a second layer of silicon atoms 32 as another "capping" layer. In this case, the spacing between device surface 32-S and the layer of dopant atoms 26, shown as doping period 34, is twice that of the arrangement in FIG. 13. Therefore, the doping density will be exactly half of the value determined for the prior arrangement—again, a quantized, discrete value.

Figure 15:
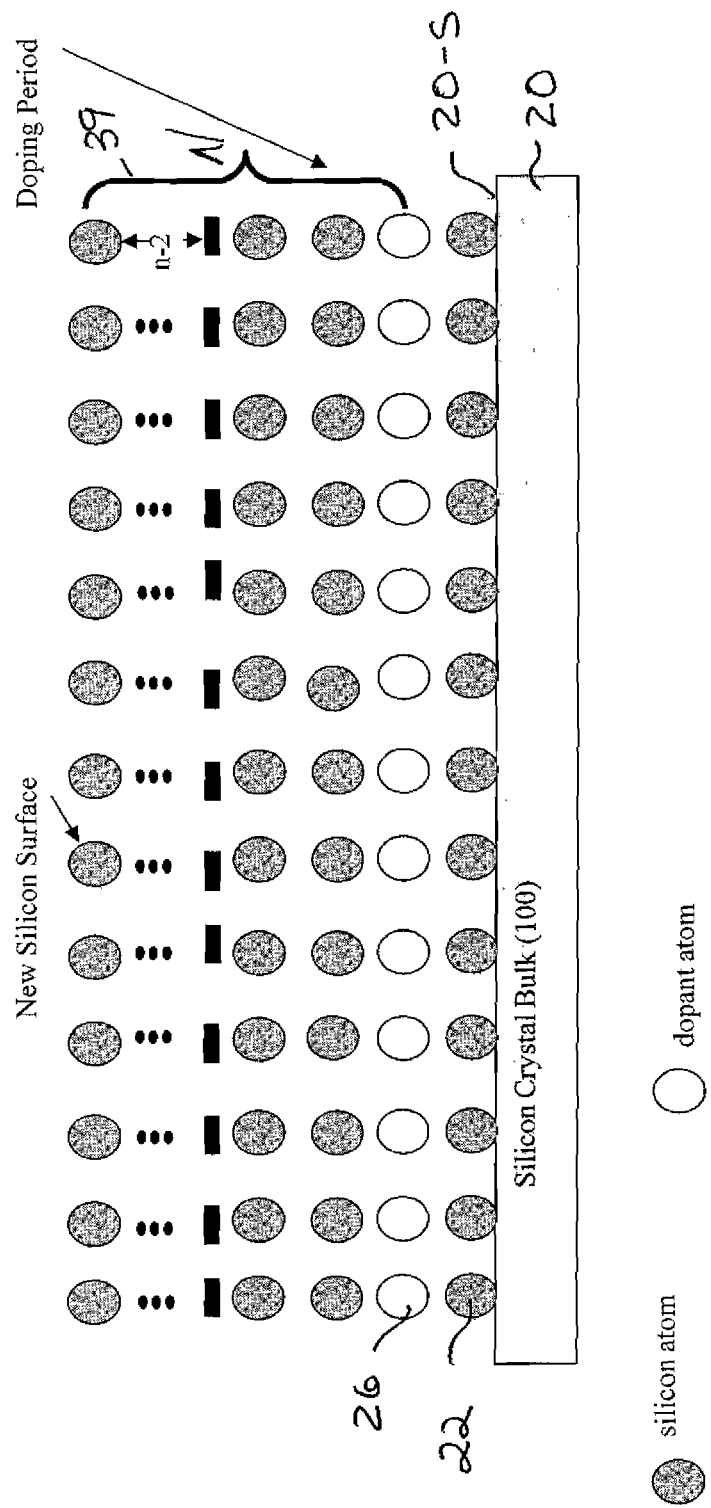
FIG. 15 illustrates an embodiment of the present invention where a plurality of N layers of silicon atoms has been deposited over the layer of dopant atoms.

This methodology can be continued on, as shown in FIG. 15, for a structure that is formed to include a plurality of N capping layers 39. As a result, the doping density will be 1/N of the value for the single capping layer embodiment of FIG. 13. In each case, therefore, only a quantized, discrete density value is possible.

Table II, contained below, is a summarization of the number of capping layers and the associated cumulative thickness of the capping structure and its resultant volume doping density:

TABLE II

| Number of "capping" layers | Grown film thickness (Å) | Volume doping density (atom-cm$^{-3}$) |
|---|---|---|
| 1 | 11 | 1.25E+22 |
| 2 | 22 | 6.24E+21 |
| 4 | 43 | 3.12E+21 |
| 10 | 109 | 1.25E+21 |
| 50 | 543 | 2.50E+20 |
| 100 | 1086 | 1.25E+20 |
| 200 | 2172 | 6.24E+19 |
| 400 | 4344 | 3.12E+19 |

Thus, by varying the number of capping monolayers from one to 400, the average volume doping density will also vary—but only in discrete values—from a highest value of 1.25E+22 atoms/cm$^3$ down to 3.12E+19 atoms/cm$^3$. It should also be noted that for a relatively small number of capping layers (e.g., 4), the volume doping density exceeds the published solid solubility of all commonly-used silicon dopants.

For the sake of completeness, Table III illustrates the same relations as shown in Table II, but in this case for both (110) silicon and (111) silicon:

TABLE III

| Number of "capping" layers | Grown film thickness Å, (110) silicon | Volume doping density cm$^{-3}$ (110) silicon | Grown film thickness Å, (111) silicon | Volume doping density cm$^{-3}$ (111) silicon |
|---|---|---|---|---|
| 1 | 8 | 2.50E+22 | 6 | 5.00E+22 |
| 2 | 15 | 1.25E+22 | 13 | 2.50E+22 |
| 4 | 31 | 6.24E+21 | 25 | 1.25E+22 |
| 10 | 77 | 2.50E+21 | 63 | 5.00E+21 |
| 50 | 384 | 4.99E+20 | 313 | 1.00E+21 |
| 100 | 768 | 2.50E+20 | 626 | 5.00E+20 |
| 200 | 1536 | 1.25E+20 | 1252 | 2.50E+20 |
| 400 | 3072 | 6.24E+19 | 2504 | 1.25E+20 |

Table IV illustrates the properties of some technologically-important semiconductor materials:

TABLE IV

| Semiconductor Material | Bandgap (eV) | Electron mobility (cm$^2$/Vs) | Hole mobility (cm$^2$/Vs) | Density (g/cm$^3$) | Breakdown Field (V/cm) | Thermal Conductivity | Coeff of Thermal expansion |
|---|---|---|---|---|---|---|---|
| Ge | 0.661 | 3900 | 1900 | 5.32 | 100,000 | 58 | 5.9 |
| Si | 1.12 | 1400 | 450 | 2.33 | 300,000 | 130 | 2.6 |
| GaP | 2.26 | 250 | 150 | 4.14 | 1,000,000 | 10 | 4.65 |
| SiC (3C, β) | 2.36 | 300-900 | 10-30 | 3.17 | 1,300,000 | 700 | 2.77 |
| SiC (6H, α) | 2.86 | 330-400 | 75 | 3.21 | 2,400,000 | 700 | 5.12 |
| SiC (4H, α) | 3.25 | 700 | | | 3,180,000 | 700 | 5.12 |
| C (diamond) | 5.46-5.6 | 2200 | 1800 | 3.52 | 5,700,000 | 600-2000 | 0.8 |

It is interesting to note that carbon (in the form of diamond) has the highest breakdown field and the highest mobility—for both electrons and holes. Silicon carbide and its variants have lower breakdown fields, as well as very low mobility for electrons and holes. Silicon (notwithstanding germanium) has the lowest breakdown field and a moderate mobility factor for electrons and holes. Ultimately, it is the breakdown field that governs a transistor's breakdown voltage. If a transistor's size shrinks, then the electric field in the device will increase. When the value of this field exceeds a critical value, breakdown occurs.

The relationship between $E_{cr}$ (the critical field) an $E_G$ (the semiconductor's band gap) is given by the following relation:

$$E_{cr}=a*10^{5}*(E_G)^n,$$

where $1.73<a<2.38$, and $2.0<n<2.5$. Therefore, it is advantageous to use wider band gap materials in order to increase the transistor's breakdown voltage.

Figure 16:
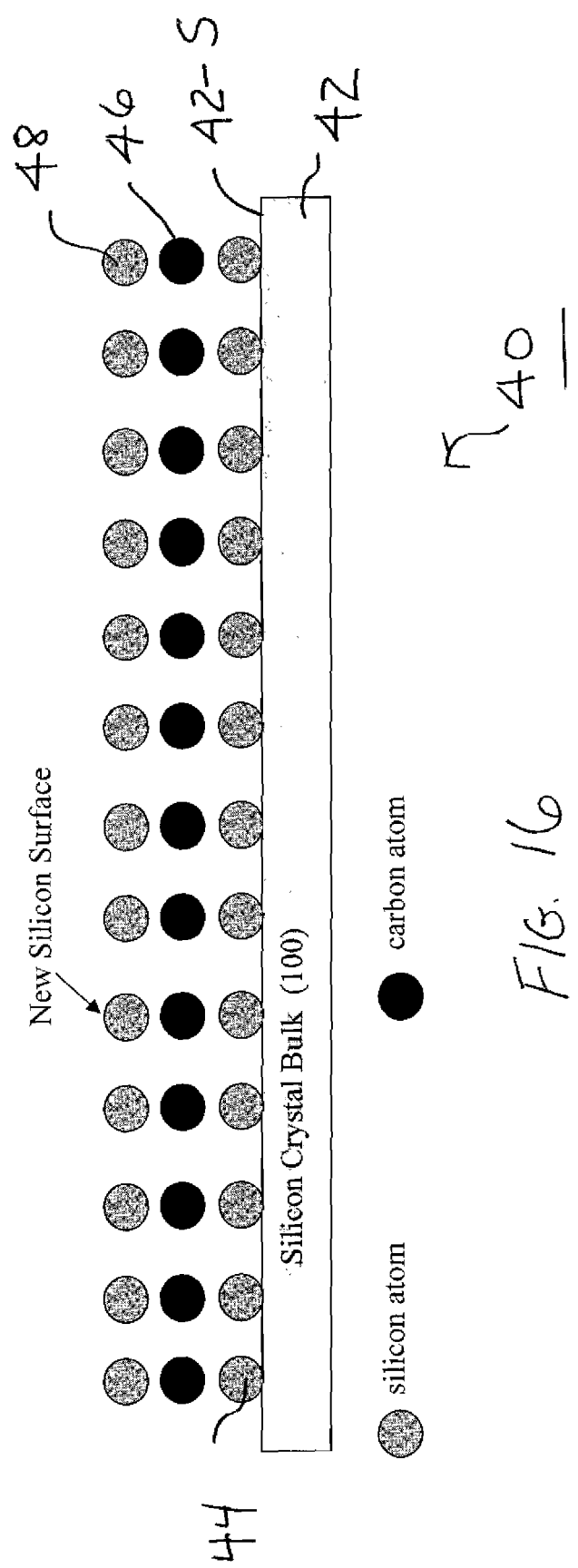
FIG. 16 shows an exemplary two-dimensional graphene sheet formed by the a self-limiting reaction, forming a quantum carbon-doped structure in accordance with the present invention.

FIG. 16 shows an exemplary two-dimensional graphene sheet 40 obtained by a self-limiting reaction, and preferably fabricated using an RTE process as described above. By definition, graphene is a flat monolayer of carbon atoms that are tightly packed into a two-dimensional honeycomb lattice. This lattice structure is then a basic building block for graphitic materials of all other dimensionalities. In this particular example, sheet 40 is formed of a (100) silicon substrate 42, with a predetermined number of silicon atoms 44 creating surface 42-S of silicon substrate 42. A number of carbon atoms 46, equal to the number of silicon atoms 44, are then deposited and will bond (in a one-to-one configuration) with silicon atoms 44. To complete this structure, another layer of silicon atoms 48 is deposited over carbon atoms 46. In comparison to FIG. 13, it is clear that the monolayer of dopant atoms 26 as illustrated in FIG. 13 has simply been replaced by a monolayer of carbon atoms 46.

Graphene is a zero-gap semiconductor. Its band structure allows the linear E-k relation for low energies to reside near the six corners of the two-dimensional hexagonal Brillouin zone, leading to zero effective mass for both electrons and holes which, in turn, gives rise to very high mobility values for both electrons and holes.

Experimentally, from conductance measurements, it has been determined that the mobility for holes and electrons is essentially identical. Further, the mobility is essentially independent of temperature in the range of 10-100° K, which implies that the dominant scattering mechanism is defect scattering. Theoretical mobility values, limited only by acoustic phonon scattering, approach nearly 200,000 $cm^2$/V*sec at room temperature. When compared to silicon, the mobility of electrons in graphene is about 140 times greater, with the mobility of holes in graphene being about 440 times greater.

Figure 17:
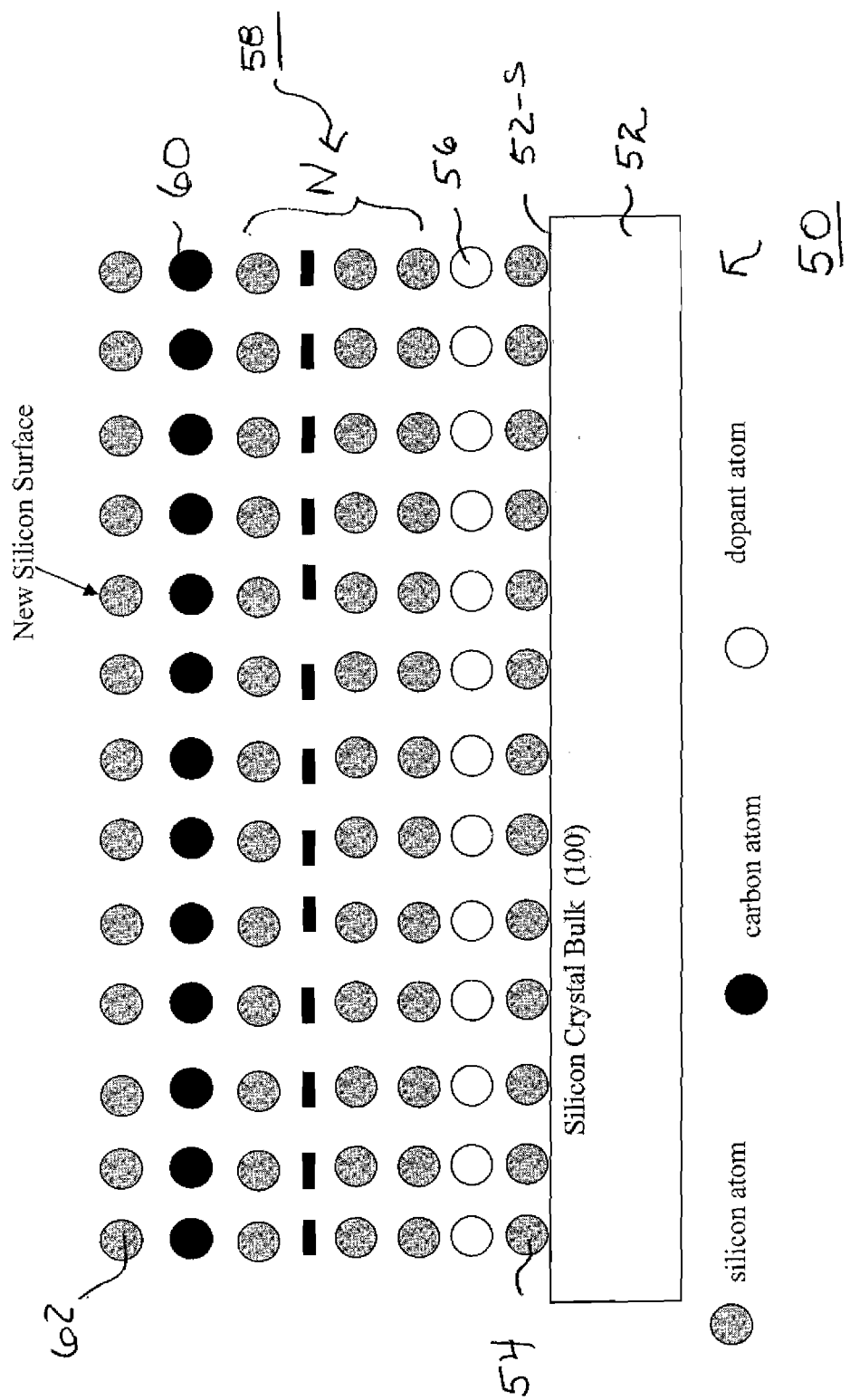
FIG. 17 is a two-dimensional view of a composite graphene/quantum-doped-silicon structure formed in accordance with the present invention.

FIG. 17 is a two-dimensional view of a composite graphene/quantum-doped-silicon structure 50 formed in accordance with the present invention. As with the other structures discussed above, it is preferred to use an RTE process in fabricating the alternating monolayers of dopant, silicon and carbon atoms. As shown, structure 50 comprises a silicon substrate 52 of (100) orientation that includes a set of silicon atoms 54 at the surface thereof. A layer of dopant atoms 56 is then deposited, where in accordance with the (100) orientation of substrate 52, the number of deposited dopant atoms 56 is equal to the number of surface silicon atoms 54 (i.e., $6.78*10^{14}$ atoms/$cm^2$).

One or more monolayers of silicon atoms 58 are then formed over dopant atoms 56. The total number layers (shown as N) is determined by the device designers and selected to achieve the desired electrical properties that are defined by the dopant density of the structure. In accordance with the (100) orientation of silicon substrate 52, the surface area coverage of these atoms will be $6.78*10^{14}$ atoms/$cm^2$ on each monolayer.

Continuing with reference to FIG. 17, a layer of carbon atoms 60 is next deposited over top monolayer N of silicon atoms 58. Again, the same number of carbon atoms 60 will be deposited and aligned as shown. Lastly, a final silicon surface layer 62 is formed over carbon atoms 64 to form the complete structure 50.

Figure 18:
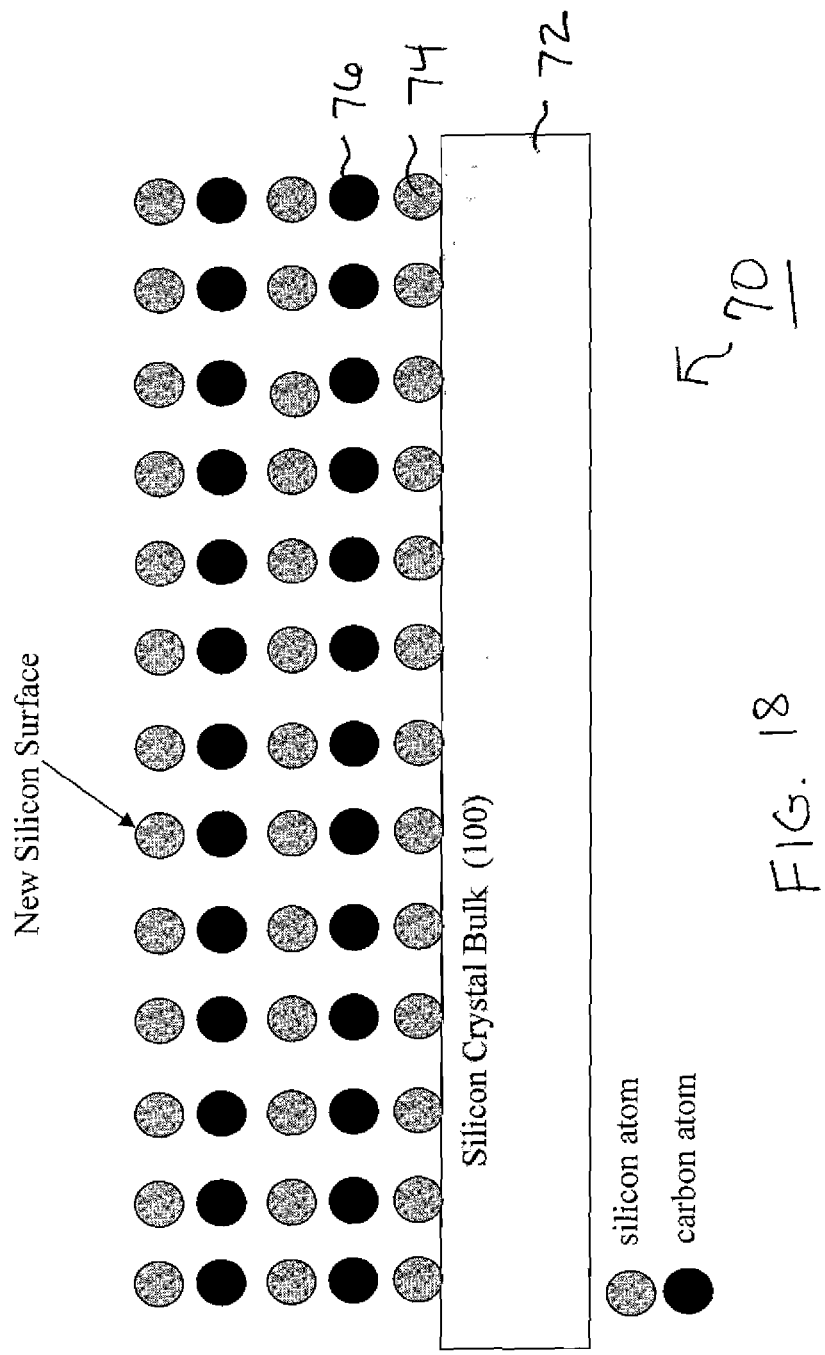
FIG. 18 illustrates an exemplary quantum-doped silicon carbide structure formed in accordance with the present invention.

FIG. 18 illustrates an exemplary quantum-doped silicon carbide structure 70 formed in accordance with the present invention (and preferably fabricated using an RTE process). As shown, structure 70 comprises a (100) silicon substrate 72 that includes the predetermined number of surface silicon atoms 74 associated with this orientation. A layer of carbon atoms 76 is then deposited over silicon atoms 74, where this layer will contain the same number of carbon atoms as silicon atoms 74 on substrate 72 (i.e., $6.78*10^{14}$ atoms/$cm^2$). In forming structure 70, the composition of the subsequently-deposited layers are alternated between silicon and carbon. This alternating structure of silicon and carbon atoms will increase the structure's critical field by about a factor of four (when compared to intrinsic silicon). Thus, this structure can be beneficial for device scaling, since using a wider band gap material increases the transistor's breakdown voltage.

Figure 19:
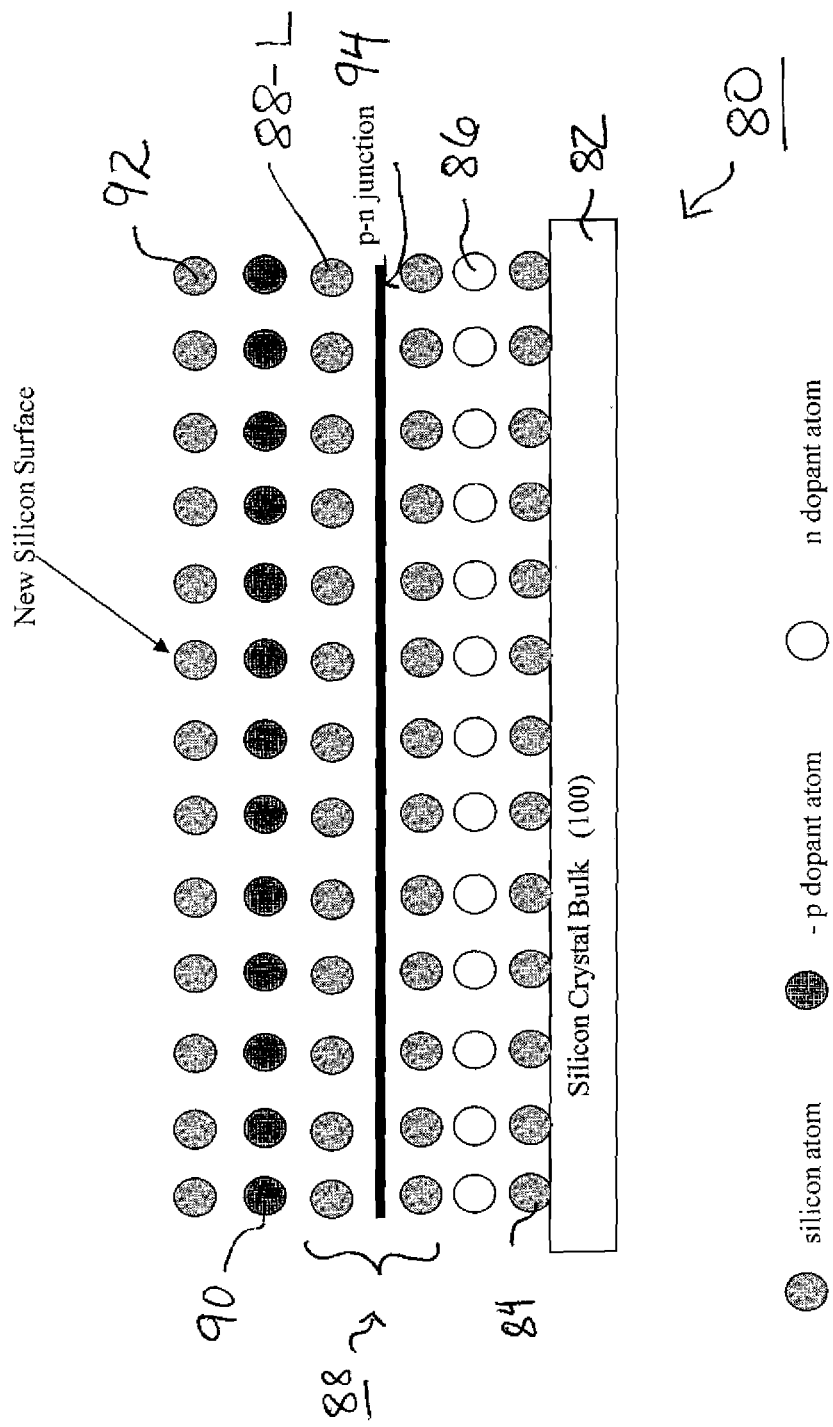
FIG. 19 illustrates an exemplary quantum-doped precision p-n junction device formed in accordance with the present invention.

A precision p-n junction device 80, formed in accordance with the present invention, in shown in FIG. 19. As shown, device 80 is formed on a (100) silicon substrate 82, where silicon substrate 82 comprises a layer of silicon atoms 84 at the surface thereof. A layer of n-dopant atoms 86 is then deposited on silicon atoms 84, where the number of deposited n-dopant atoms 86 equals the number of surface silicon atoms 84 (which is $6.78*10^{14}$ atoms/$cm^2$). Following the deposit of n-dopant atoms 86, one or more monolayers of silicon atoms 88 are formed on n-dopant atoms 86 (in this case, a plurality of N monolayers of silicon atoms 88 are shown). A layer of p-dopant atoms 90 are then deposited on a last-formed layer of silicon atoms 88-L.

A top layer of precision p-n junction device 80 is formed by depositing a layer of silicon atoms 92 over p-dopant atoms 90. As formed, device 80 will exhibit a p-n junction interface 94 at the exact half-way point between the monolayer of n-type dopant atoms 86 and the monolayer of p-type dopant atoms 90.

In accordance with the quantum doping aspects of the present invention, junction interface 94 will be perfectly symmetrical, with the n-type dopant density being identical to the p-type dopant density (i.e., the structure will exhibit a "mirror image" with respect to the location of junction interface 94). Thus, device 80 is referred to as a "precision" p-n junction device, since the position of interface 94 and the carrier concentration on each side of interface 94 depends only on the number of surface silicon atoms 84 and the number (N) of layers of silicon atoms 88 deposited between p-dopant atoms 86 and n-dopant atoms 90.

Figure 20:
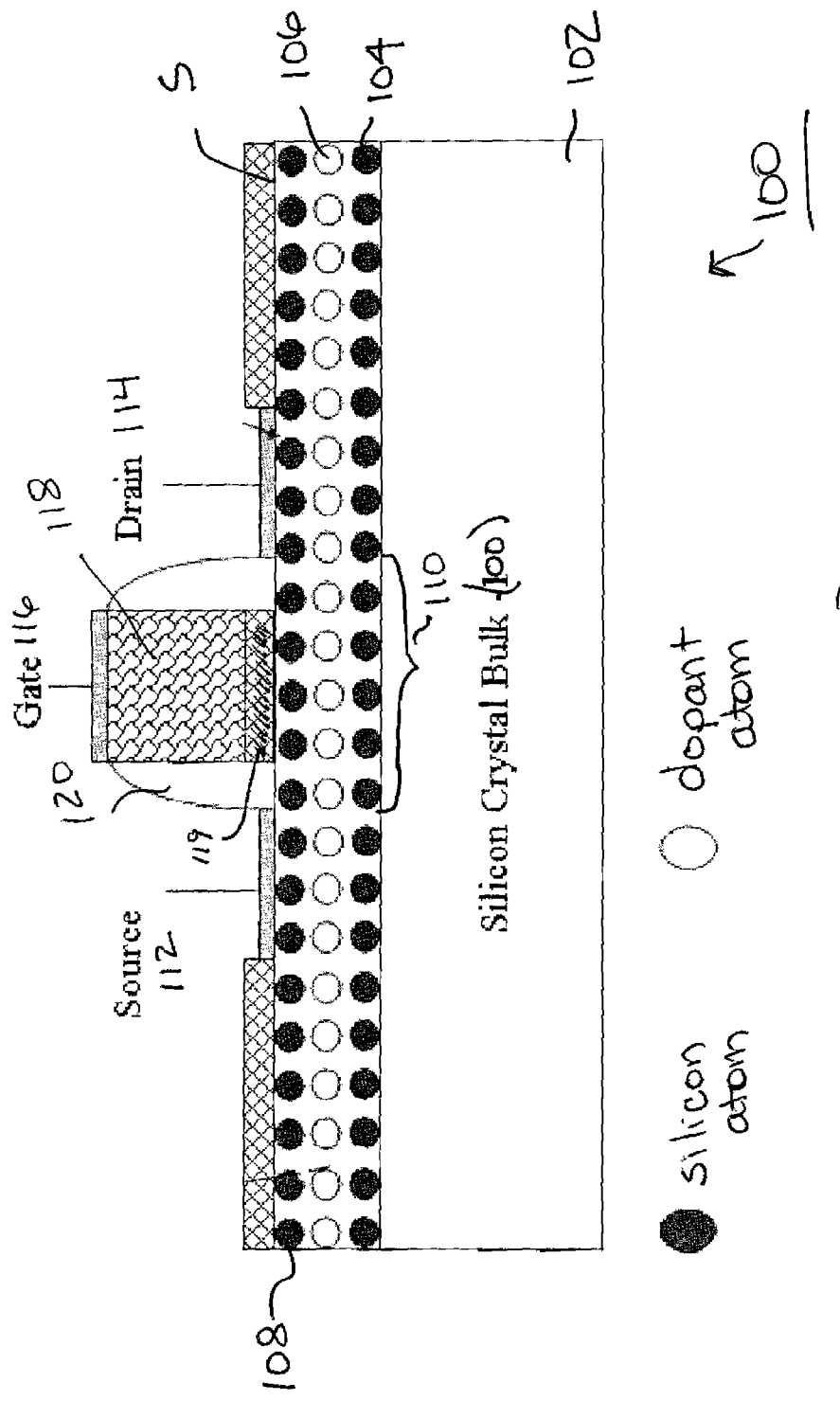
FIG. 20 illustrates an exemplary junction-less MOS (JMOS) transistor that can be formed by using quantum doping in accordance with the present invention.

Building upon the above-described concept of creating precision p-n junctions using quantum doping, it is possible to form various types of transistors using these same quantum doping techniques in various regions of each device in accordance with the principles of the present invention. FIG. 20 illustrates an exemplary junction-less MOS (JMOS) transistor 100 that can be formed by using quantum doping in accordance with the present invention. As shown, JMOS transistor 100 is formed on a silicon substrate 102 that includes a surface layer of silicon atoms 104 (as described above). A monolayer of dopant atoms 106 is then deposited on silicon atoms 104 (using, preferably, an RTE process), and a new silicon surface S is created by depositing one or more layers of silicon atoms 108 over dopant atoms 106. Dopant atoms 106 thus form a channel region 110 of JMOS transistor 100, where in accordance with the present invention, the doping concentration of channel region 110 remains constant across the width of channel region 110 from a source contact 112 to a drain contact 114. A gate contact 116 is shown as formed between source contact 112 and drain contact 114, where gate contact 116 is separated from silicon surface S by a gate oxide region 118 and a polysilicon layer 119. Sidewall spacers 120 may be included to form a self-aligned device structure.

As mentioned above, the doping concentration of channel region 110 is uniform, by virtue of using the quantum doping process of the present invention; as a result, the portion of channel region 110 underlying source contact 112 exhibits the same doping concentration as the portion of channel region 110 underlying drain contact 114. In fabrication an "n-channel" device, channel region 110 is uniformly doped with a layer of n-type dopant atoms (and polysilicon gate layer 119 is doped with a p-type dopant). The work-function difference between gate contact 116 and channel region 110 shifts both the flatband voltage and threshold voltage to positive values. For a "p-channel" device, opposite dopant polarity is used.

A significant feature in the fabrication of a JMOS transistor is the formation of a semiconductor layer that is thin enough to allow for the full depletion of carriers when the device is turned "off". The semiconductor also needs to be rather heavily doped in order to allow for sufficient current to develop when the device is turned "on". By providing consistent, repeatable doping concentrations when using a quantum doping process in accordance with the present invention, the ability to form a "thin", yet heavily-doped, layer is relatively straightforward to accomplish.

Figure 21:
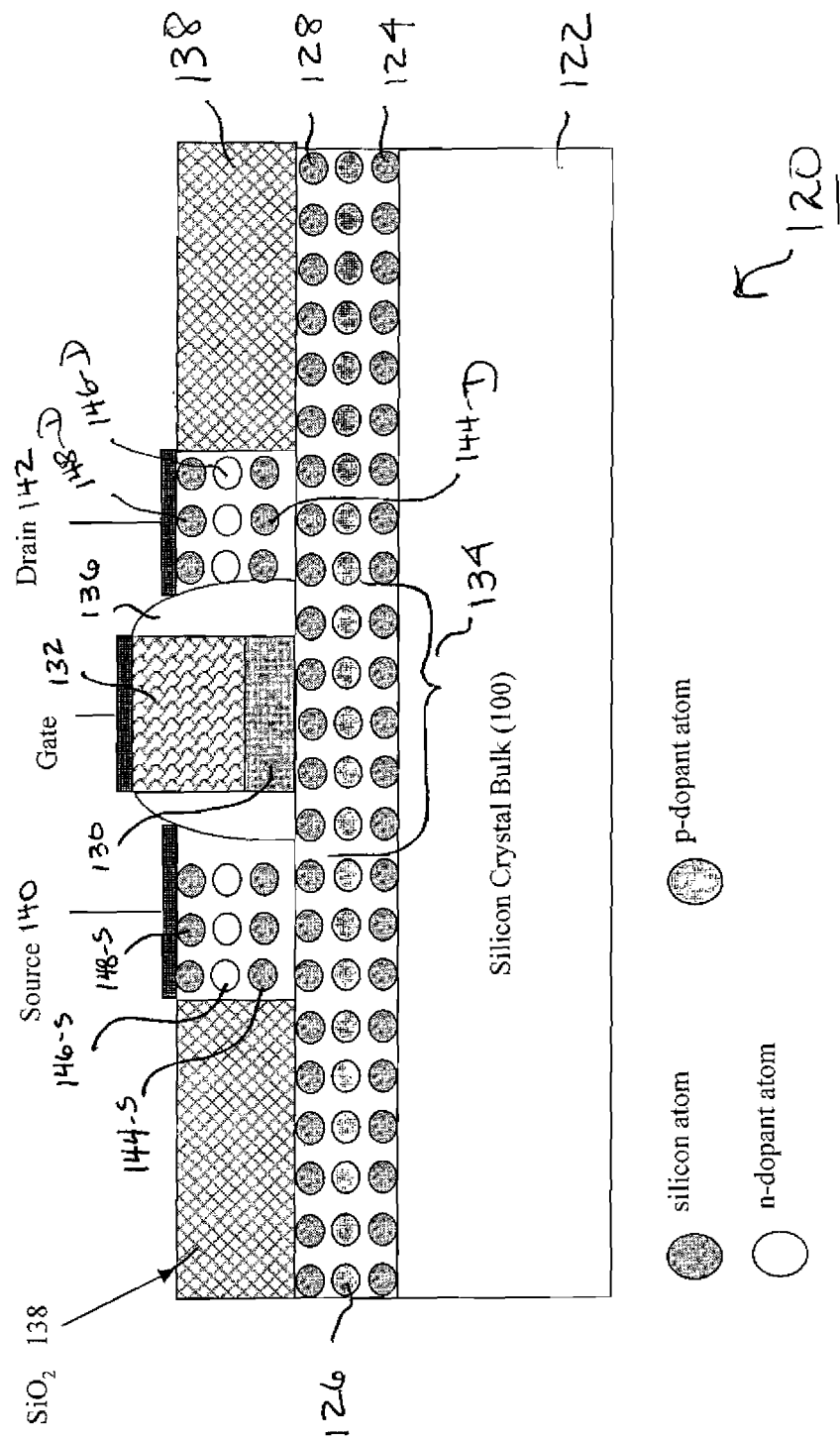
FIG. 21 illustrates an exemplary NMOS transistor formed using quantum doping in accordance with the present invention.

FIG. 21 illustrates an exemplary NMOS transistor 120 formed using quantum doping in accordance with the present invention. Transistor 120 is shown as formed on a silicon substrate 122 of (100) orientation that includes a surface layer of silicon atoms 124. A layer of dopant atoms 126 (in this case, being p-type dopant) is then deposited on silicon atoms 124, with one or more monolayers of silicon atoms 128 deposited over dopant atoms 126, the termination of this step in the process defining a "new" silicon surface 128-S for transistor 120. As described in detail in all previous embodiments, the doping concentration of this structure is defined by two factors: (1) the number of atoms in the layer of surface silicon atoms 124 (i.e., $6.78*10^{14}$ atoms/cm$^2$); and (2) the number N of monolayers of silicon atoms formed over dopant atoms 126.

At this point in the process, a polysilicon gate region 130 and gate oxide region 132 are formed as shown, defining a channel region 134 within the doped silicon structure. A pair of sidewall spacers 136 is formed as shown on either side of the gate structure. Polysilicon gate region 130 is doped n-type to achieve a positive threshold voltage ($V_{th}$). Continuing, a dielectric (insulating) layer 138 is then formed over surface 128-S, where in most cases layer 138 comprises silicon dioxide (SiO$_2$). Windows are opened in layer 138 in the regions where the source and drain device regions are to be formed.

In accordance with the present invention, a source region 140 and a drain region 142 are formed using the quantum doping technique of the present invention. In particular, a first layer of silicon atoms 144 is deposited in the openings of layer 138, where these silicon atoms will bond with surface silicon atoms 128. In this case, a "selective" self-limiting reaction is used (such as selective RTE), where the atoms will only deposit in the open windows, and not on the surface of dielectric layer 138. A layer of n-type dopant atoms 146 is next formed on silicon atoms 144, with one or more monolayers of silicon atoms 148 then formed over dopant atoms 146 (again, the number of silicon atoms in each "starting" region, in combination with the number of overlying silicon layers, defining the dopant concentration in source region 140 and drain region 142. In accordance with the quantum doping method of the present invention, these regions will exhibit an identical dopant concentration—a result that is particularly advantageous when fabricating nanoscale transistor devices. A first precision p-n junction is thus created along interface 148-S (associated with source region 140) and a second precision p-n junction is created at interface 148-D (associated with drain region 142).

It is to be understood that a PMOS device can be formed in the same manner as set forth above in describing the formation of NMOS transistor 120, where in the formation of a PMOS device the location of the p-type dopant atoms and n-type dopant atoms is reversed. As a further extension, it is possible to form an exemplary CMOS transistor structure, including both an NMOS device and a PMOS device, using the quantum doping method of the present invention in a self-limiting process that controls the precise number of atoms that are deposited during each step in the process.

Figure 22:
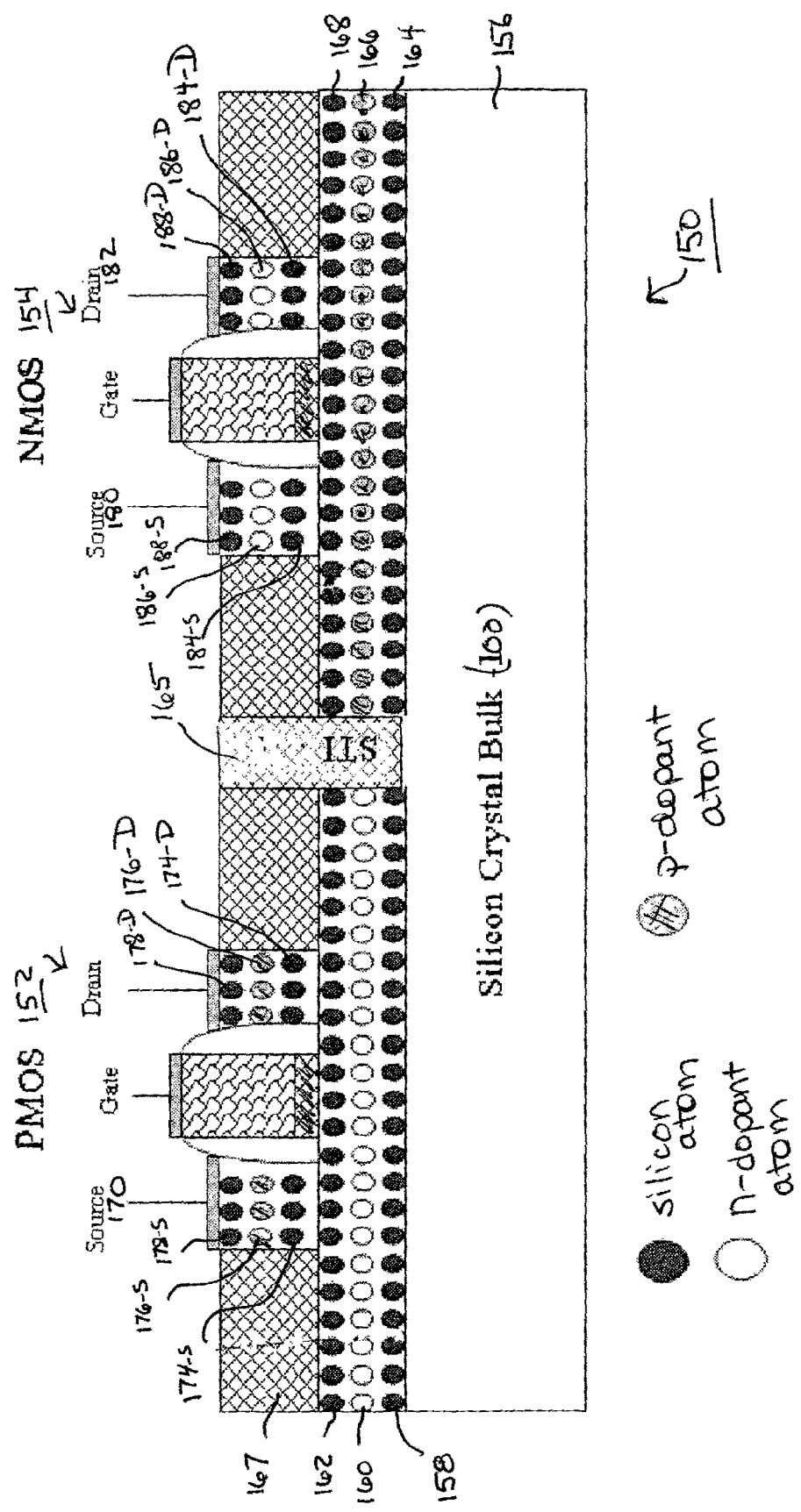
FIG. 22 illustrates an exemplary CMOS transistor formed in accordance with the present invention, with the CMOS transistor including both a PMOS device and an NMOS device.

FIG. 22 illustrates an exemplary CMOS transistor 150 formed in accordance with the present invention, with transistor 150 including both a PMOS device 152 and an NMOS device 154. In one exemplary formation process, the region where NMOS device 154 may first be covered and the quantum doping process of the present invention used to form an initial portion of PMOS device 152. In particular, a first surface region of silicon substrate 156 is defined as having a number of silicon atoms 158 as dictated by the orientation of substrate 156. A monolayer of n-dopant atoms 160 is then formed over silicon atoms 158 (the number of dopant atoms 160 being equal to the number of underlying silicon atoms 158, in accordance with the "quantization" principles of the present invention). A "capping" layer of one or more monolayers of silicon atoms 162 is then deposited over dopant atoms 160.

At this point in the process, the region of PMOS device 152 is then covered and the region of NMOS device 154 exposed and similarly processed, with a layer of p-dopant atoms 164 deposited over a like number of surface silicon atoms 166. A capping monolayer of silicon atoms 168 is deposited over dopant atoms 164, as shown in FIG. 22. It is an aspect of the present invention that the regions defined for devices 152 and 154 can be well controlled such that the same number of atoms is included in the monolayers formed in each region.

The adjacent regions of devices 152 and 154 are separated by an isolation region, shown as shallow trench isolation (STI) region 165. STI region 165 can be formed using well-known CMOS fabrication techniques. An additional isolation (dielectric) layer 167 is created at this point, where the appropriate areas of layer 167 are thereafter processed to create the specific regions of PMOS device 152 and NMOS device 154. In accordance with the present invention, source region 170 and drain region 172 of PMOS device 152 are each formed to comprise a single monolayer of silicon atoms 174 (shown as layers 174-S and 174-D, respectively). Thereafter, a layer of p-type dopant atoms 176 is formed (176-S and 176-D) and covered with one or more layers of silicon atoms 178 (178-S and 178-D). NMOS device 154 is similarly formed to create a source region 180 and a drain region 182, comprising a monolayer of silicon atoms 184, a monolayer of n-type dopant atoms 186 and one or more monolayers of silicon atoms 188.

While the structures shown in FIGS. 20-22 utilize the inventive quantum doping process in the formation of all of the doped regions, it is to be understood that it is also possible to combine the use of quantum doping with other, more conventional, doping processes. In this case, quantum doping is used for those areas where it is necessary to create precision p-n junctions and eliminate the possibility of RDF, with traditional thermal or ion implantation processes used to dope the remaining areas.

Figure 23:
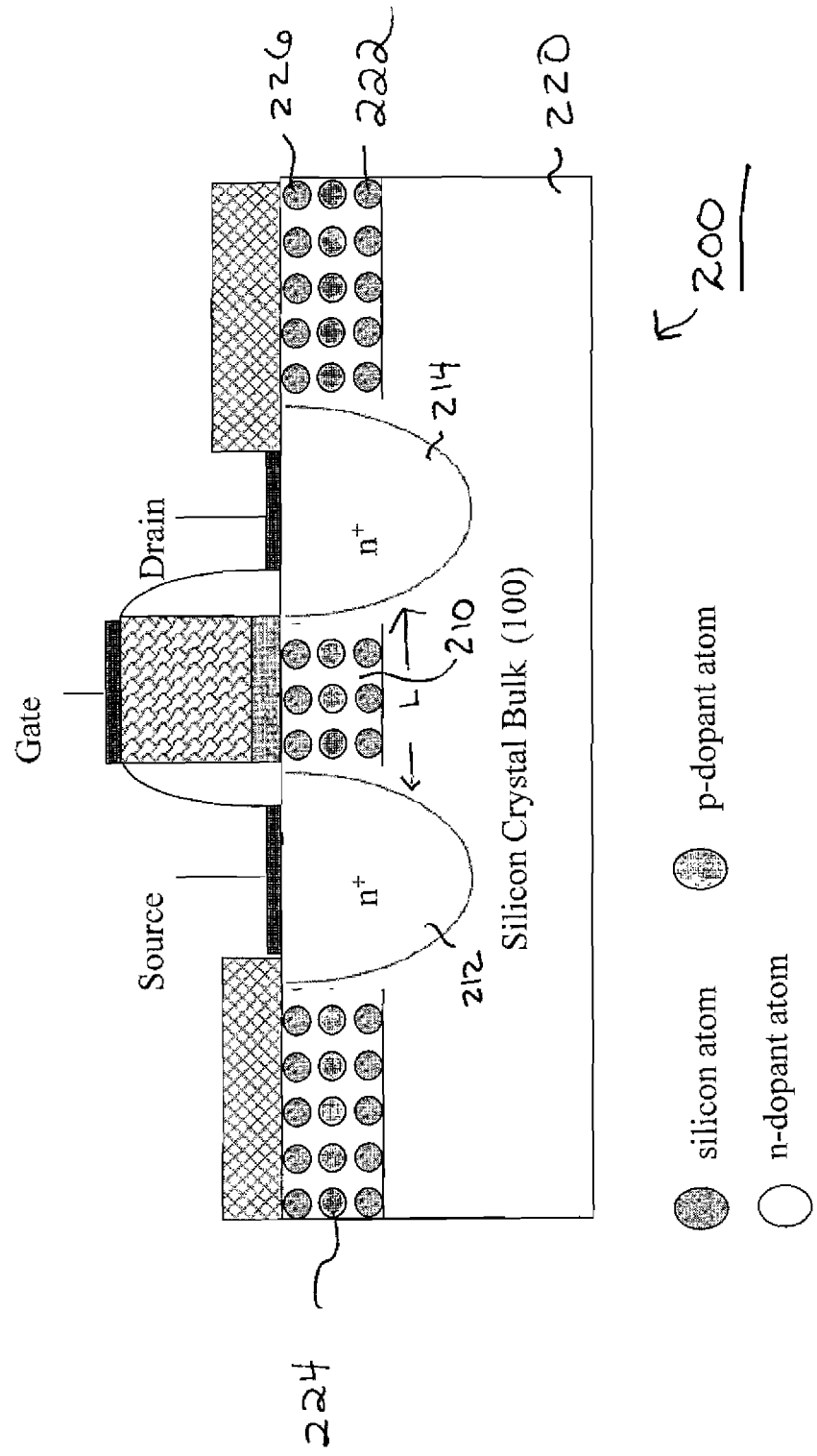
FIG. 23 illustrates an exemplary NMOS device where quantum doping is used to create a channel region with a uniform dopant concentration.

FIG. 23 illustrates an exemplary NMOS device 200 where quantum doping is used to create a channel region 210 with a uniform dopant concentration. Source region 212 and drain region 214 are formed using a conventional process (such as furnace diffusion or ion implantation). In formation, a silicon substrate 220 is first provided and defined as including a number of surface silicon atoms 222. In order to form an NMOS structure, a p-dopant is introduced into silicon substrate 220. In accordance with the present invention, an appropriate self-limiting process (such as RTE) is used to deposit a like number of p-type dopant atoms 224 on silicon atoms 222. One or more layers of silicon atoms 226 are then deposited over p-type dopant atoms 224 to create a "new" silicon surface 228. By virtue of using the quantum doping process, the concentration of p-type atoms in channel region 210 is uniform across its length (shown as "L" in FIG. 23).

Once this "precision" channel region 210 is formed, conventional processing techniques are used to introduce n-type dopants into source region 212 and drain region 214 (as well as subsequent processing steps).

Figure 24:
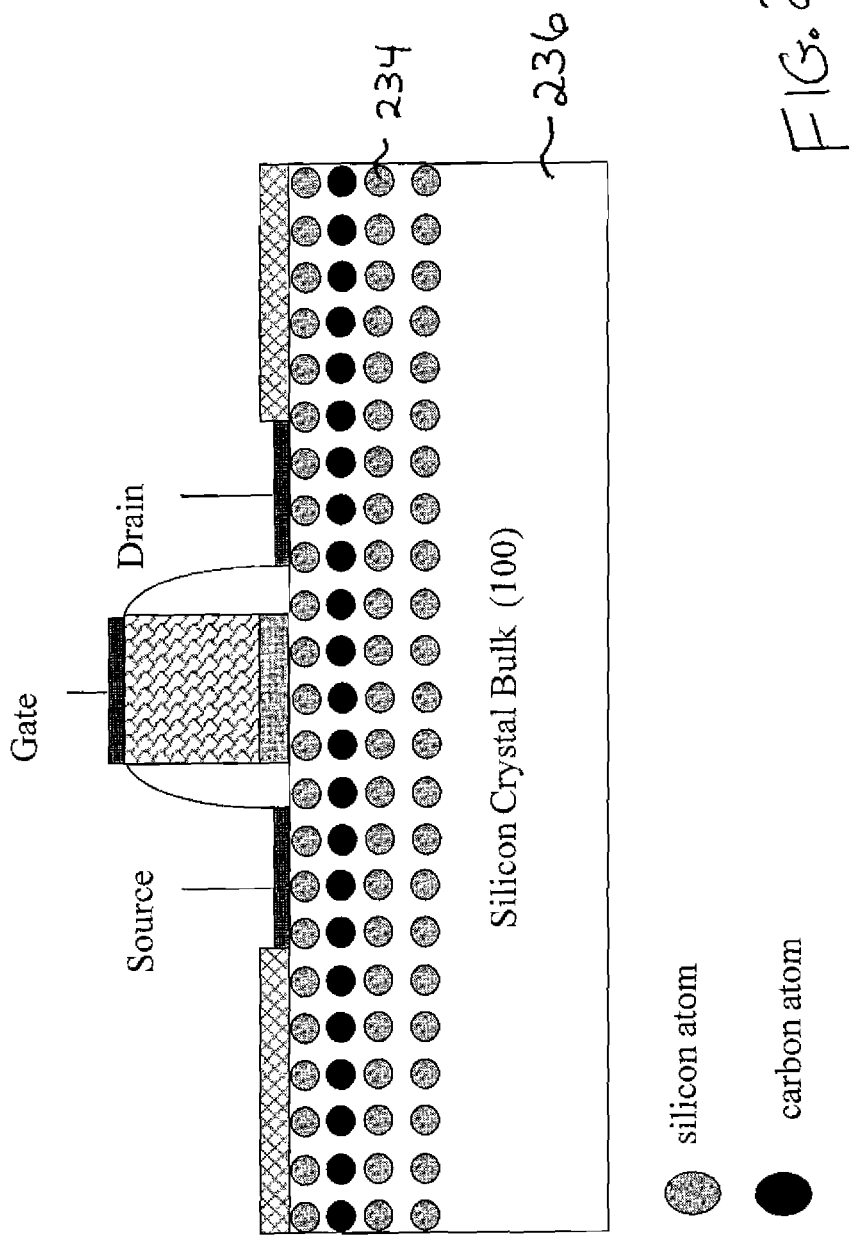
FIG. 24 illustrates an exemplary JMOS graphene transistor formed in accordance with the present invention where the quantum process is used to deposit a defined number of carbon atoms over a surface layer of silicon atoms.

FIG. 24 illustrates an exemplary JMOS graphene transistor 230 formed in accordance with the present invention. In this case, the quantum process is used to deposit a defined number of carbon atoms 232 over a surface layer of silicon atoms 234 as defined as part of a silicon substrate 236. The properties of such a graphene structure were briefly discussed above, where this structure is useful in tailoring the specific electrical properties that are desired for certain devices.

Figure 25:
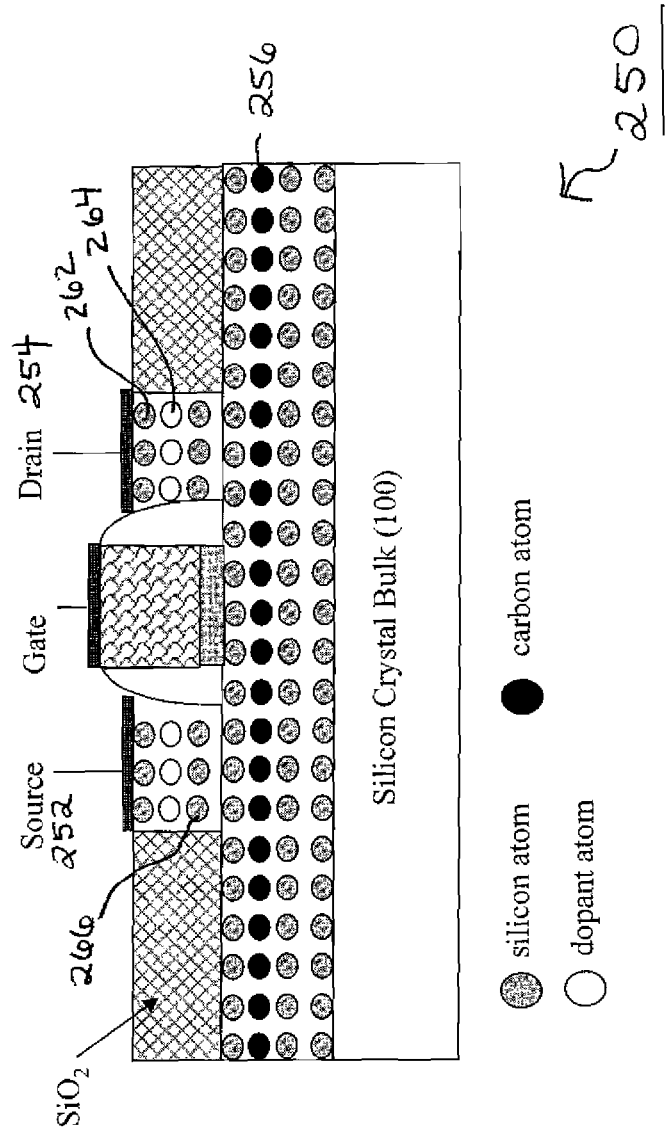
FIG. 25 illustrates an alternative structure of a JMOS graphene transistor formed in accordance with the present invention, which in this case is formed to include doped source and drain regions.

FIG. 25 illustrates an alternative structure of a JMOS graphene transistor 250, which in this case is formed to include doped source and drain regions 252 and 254, respectively. As with the embodiment in FIG. 24, the beginning silicon substrate is processed to include a monolayer of carbon atoms 256. Thereafter, the quantum doping process of the present invention as described above is used to form an initial layer of silicon atoms 258, dopant atoms 260 and silicon atoms 262 in both source region 252 and drain region 254.

Figure 26:
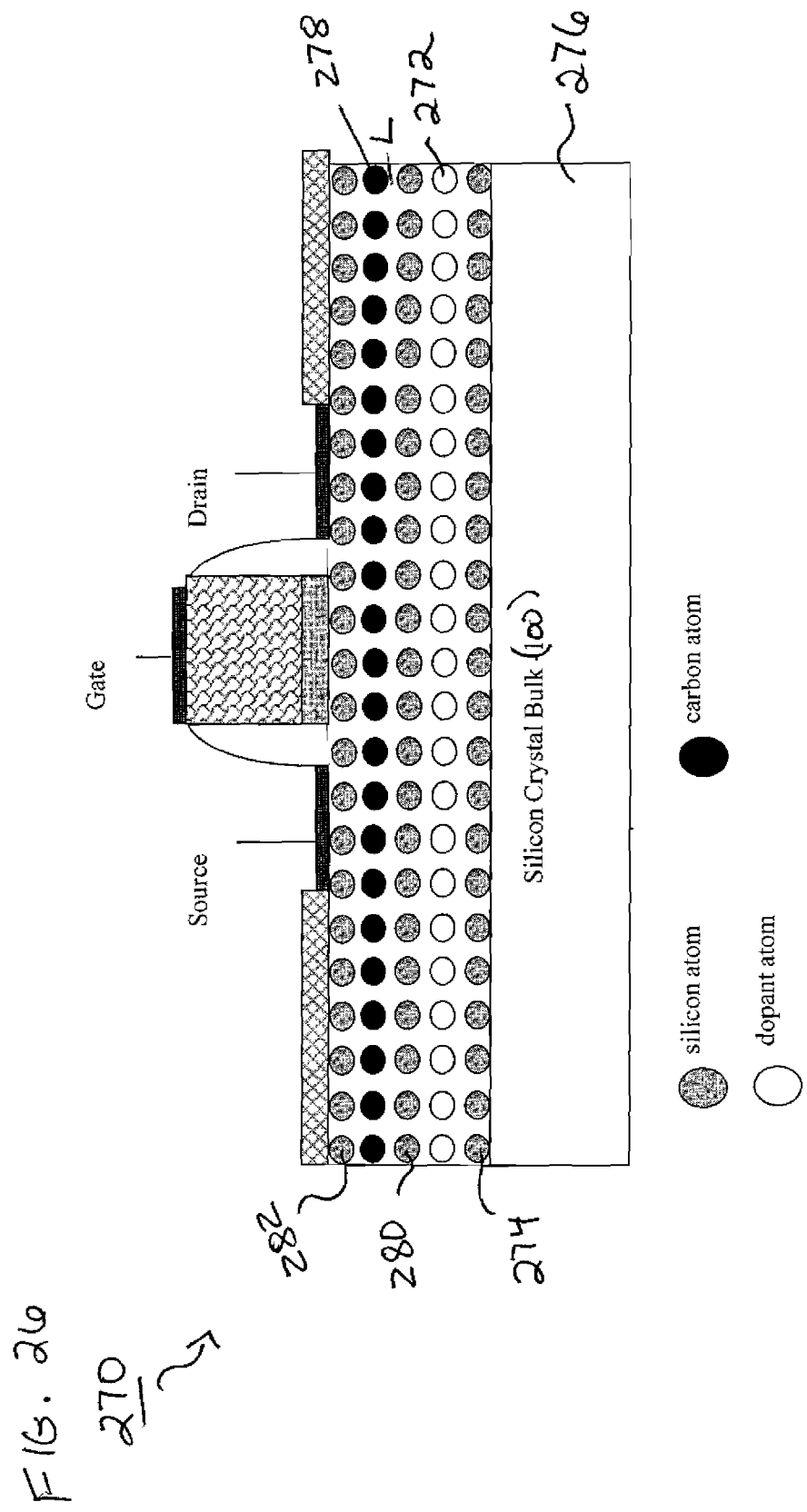
FIG. 26 shows a junction-less MOS (JMOS) transistor created to include a layer of dopant atoms deposited above, and bonded in a one-to-one relationship to a surface layer of silicon atoms.

Another variation of a structure that may be formed using quantum doping in accordance with the present invention is shown in FIG. 26. In this case, a junction-less MOS (JMOS) transistor 270 is created that is formed to include a layer of dopant atoms 272 deposited above, and bonded in a one-to-one relationship to a surface layer of silicon atoms 274 of a silicon substrate 276. Since the number of silicon atoms occupying a given area is a known quantity (being a function of the orientation of silicon substrate 276), the precise number of deposited dopant atoms 272 will also be known (and be equal to the number of silicon atoms 274).

In this particular embodiment, silicon substrate 276 is further processed to include a layer of carbon atoms 278. As shown, one or more layers of silicon atoms 280 are first deposited over dopant atoms 272 (the number of layers defining the dopant concentration of the structure), with the layer of carbon atoms 278 then deposited over and bonded to a top layer L of silicon atoms 280. To finalize the composition of the structure for further processing, one or more layers of silicon atoms 282 is formed over carbon atoms 278. While the arrangement as shown in FIG. 26 includes only a single layer of carbon atoms 278, it is to be understood that repeated alternations of carbon deposition and silicon deposition may be employed to form a substrate structure having multiple, alternating monolayers of silicon and carbon, where the ultimate electrical properties of devices formed in this structure will be defined by the properties of the substrate material.

Figure 27:
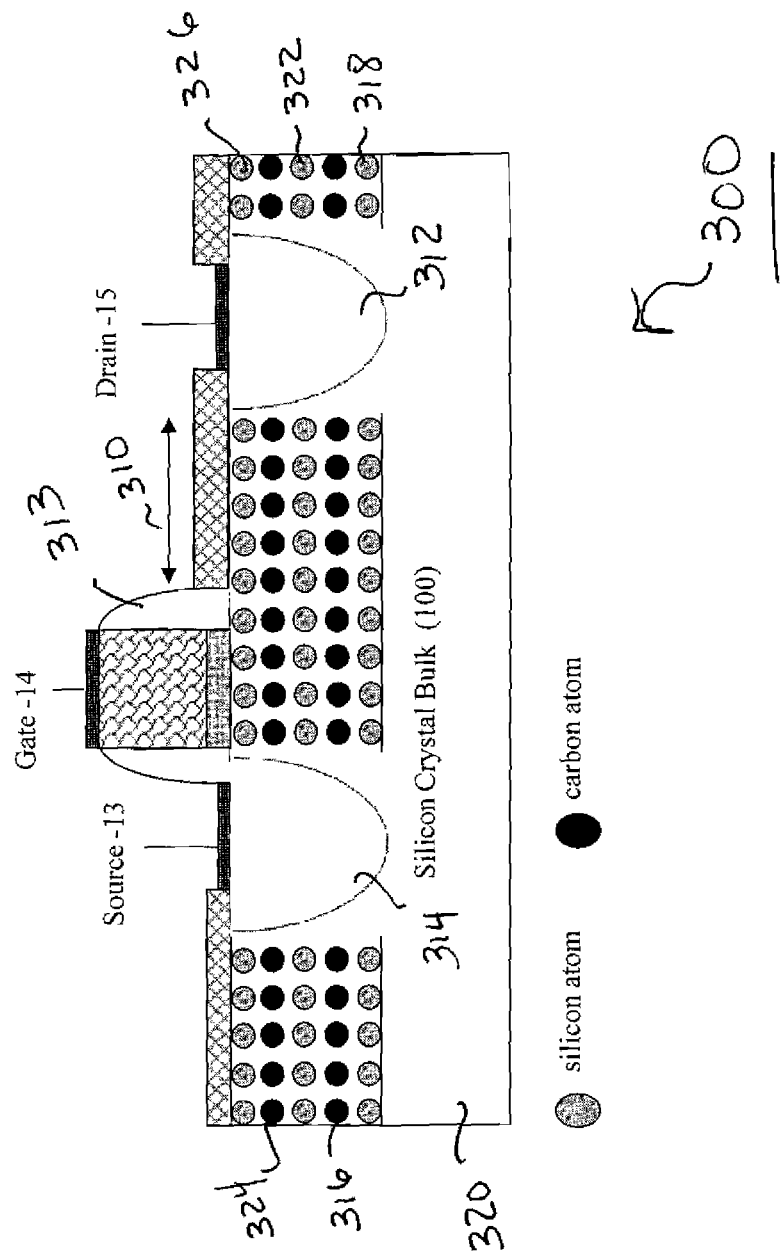
FIG. 27 illustrates an exemplary power JMOS silicon carbide transistor that may be formed using the quantum process of the present invention.

FIG. 27 illustrates an exemplary power JMOS silicon carbide transistor 300 that may be formed using the quantum process of the present invention. The most prominent feature of transistor 300 is drain extension region 310. Drain extension region 310 is achieved via a photolithographic technique that is used to shift the location of drain region 312 with respect to gate sidewall spacer 313. In this case, drain extension region 310 functions as a resistor in series with drain region 312 and reduces the electric field in drain region 312 below a critical value (thus allowing the device to exhibit a higher breakdown voltage—i.e., forming a "power" device).

In this particular arrangement, drain region 312 and an associated source region 314 are formed using conventional doping techniques (such as furnace diffusion and/or ion implantation). The overall process of forming transistor 300 does begin, however, with a quantum doping process. As shown, a first layer of carbon atoms 316 are deposited on a like number of silicon atoms 318 at the surface of a silicon substrate 320. One or more layers of silicon atoms 322 are then deposited on first layer of carbon atoms 316, with a second layer of carbon atoms 324 then deposited on a top layer L of silicon atoms 322. A final silicon "capping" layer 326 is then deposited over the second layer of carbon atoms 324. Throughout this process, the number of atoms forming each layer remains constant (and equal to the number of silicon surface atoms 318). Once the "quantum configured" substrate material has been formed, the conventional processing steps are used to form source region 314 and drain region 312, where drain extension region 310 is comprises of a portion of the quantum-configured substrate and, as a result, exhibits a consistent resistive value.

Illustrative Examples

As described above, quantum doping via RTE starts with an appropriate wafer cleaning preparation to remove surface impurities. After that, the wafer is placed in the apparatus for RTE processing, as shown in FIG. 6. The chamber is evacuated via a vacuum pump and purged with a pure inert gas (such as nitrogen or helium) for at least two minutes. Next, the wafer is heated to slightly less than 1000° C. in an atmosphere of reactive gases (e.g., a mixture of $H_2$ and HF) for about five minutes. This step removes any residual native oxide, leaving an atomically clean surface that exposes the surface silicon atoms and their unterminated bonds, as shown in FIG. 10.

At this point, the temperature in the chamber is substantially lowered (for example, to less than 450° C.). A mixture of suitable silicon-containing source material (for example, silane, dichlorosilane or trichlorosilane) and n-dopant source material (for example, arsine or phosphine) or p-dopant source material (for example, diborane) is introduced into the chamber. All gas valves, including the pump valve, are then closed (i.e., put in the OFF position) to allow some time (typically less than one minute) for the process materials to obtain thermal equilibrium. At this point, which is shown in FIG. 11, the temperature is rapidly increased to a value between 500° C. and 1200° C. for a period of time greater than several milliseconds, but less than ten seconds so that the reagent-limited reaction (that is, the self-limiting reaction) will take place. Dopant atoms chemisorb or react with the silicon surface atoms, resulting in the formation of the so-called "saturated" chemisorbed layer—with no further adsorption possible. Under these reaction conditions, the film growth (or deposition) is self-limiting; that is, the amount of film material deposited (or grown) is a constant. The amount of reacting gases is limited so as to from only a single monolayer of dopant atoms of the pre-determined type (that is, either n-type or p-type).

In accordance with this process of the present invention, all of the dopant atoms are located in substitutional positions, are electrically active and thereby achieve a dopant efficiency of 100%. Further, the substitutional positioning means that the surface doping density (or density per unit area) will always be equal to the silicon surface's atomic density. The resultant volume dopant density (or density per unit volume) then depends only on the number N of undoped silicon atomic monolayers that are grown over the layer of dopant atoms. Therefore, the volume dopant density is necessarily taken from a set of finite numbers—a "quantized" structure.

After performing the deposition of a layer of dopant atoms, the process continues by lowering the temperature of the chamber (to a value less than 450° C., for example). A pure inert gas (such as nitrogen or helium) is introduced into the chamber for at least two minutes, with the vacuum pump valve opened. The reaction effluents are then evacuated from the chamber during this "flush" step.

Next, a suitable silicon-containing material is introduced into the chamber and, again, all gas valves are closed to allow some time for thermal equilibrium to be restored. At this point, which is shown in FIG. 12, the temperature is rapidly increased to a value less than 900° C. for a period of time greater than several milliseconds, but less than ten seconds so that the reagent-limited reaction (that is, the self-limiting reaction) will take place. The amount of reacting gases is limited so as to form just a single monolayer of silicon atoms (terminating the bonds of the surface dopant atoms), which is defined as the "new" silicon surface.

After conducting the deposition of this silicon monolayer, the temperature in the chamber is lowered (for example, to less than 450° C.). A pure inert gas (such as nitrogen or helium) is then introduced into the chamber for at least two minutes and the vacuum pump valve is opened. Reaction effluents are evacuated from the chamber during this "flush" process. This is defined as a final step in a single monolayer quantum doping process.

It is to be understood that if it is desired to form several monolayers of silicon atop the layer dopant atoms, these latter two processing steps are repeated until the proper number of monolayers has been formed. The ultimate film thickness is thus determined by the number of layers of atoms formed and is very precise.

Advantageously, the quantum doping method of the present invention does not need to tightly control the reactant flux homogeneity, which gives rise to a very large area of reproducibility. Also, the use separate feeds for each reactant gas (as shown in the exemplary arrangement of FIG. 6), prevents un-wanted gas-phase reactions and allows for each reaction step to reach full completion. This results in atomically-pure films being deposited. The quantum doping method has a wide processing window that makes the process rather insensitive to moderate changes in temperature and reactive gas flows, allowing for the processing of multilayer structures in a continuous process.

In some applications, where only doping of the bulk silicon substrate is required, it is not necessary to use a self-limiting reaction mode. Instead, a constant flow of reactive gases (for example, silane) will enter the apparatus for RTE and requisite valves will remain open (including the vacuum pump valve). Unlimited reaction resulting in deposition (or growth) of silicon will take place with a growth rate of as low as ten silicon monolayers per minute upwards to depositing thousands of monolayers per minute.

In some applications, such as "engineered materials", the quantum doping method is modified to provide, for example, a two-dimensional graphene sheet, as shown in FIG. 16. The process of forming an engineered material again begins with first providing an atomically clean surface, as described above. Then, a mixture of suitable silicon-containing source material (for example, silane, dichlorosilane or trichlorosilane) and carbon-containing source material (for example, methane) is introduced into the chamber. All gas valves, including the pump valve, are then closed (i.e., put in the OFF position) to allow some time (typically less than one minute) for the process materials to obtain thermal equilibrium. At this point, which is shown in FIG. 11, the temperature is rapidly increased to a value between 500° C. and 1200° C. for a period of time greater than several milliseconds, but less than ten seconds so that the reagent-limited reaction (that is, the self-limiting reaction) will take place.

The carbon atoms in the methane chemisorb or react with the silicon surface atoms, resulting in the formation of the so-called "saturated" chemisorbed layer—with no further adsorption possible. Under these reaction conditions, the film growth (or deposition) is self-limiting; that is, the amount of film material deposited (or grown) is a constant. The amount of reacting gases is limited so as to from only a single monolayer of carbon atoms.

Once the monolayer of carbon atoms has been deposited, the process continues in a manner similar to that described above, with a deposition of a layer of silicon atoms followed by a flushing of effluent (and repeated for each layer of silicon atoms that is desired to be created).

A modified engineered material in the form of a composite graphene/quantum doped substrate may be formed by carefully controlling the sequence of the various processes described above, forming an engineered substrate material such as that shown in FIG. 17.

Some devices formed in accordance with the present invention require the use of a selective quantum doping method (preferably a selective RTE method) to form various device regions (as such for the NMOS and PMOS devices described above). The formation of the substrate material for these devices is similar to that described above. Once the substrate has been formed (including, when needed, a layer of dopant atoms, a layer of carbon atoms, or layers of both), a pure inert gas (such as nitrogen or helium) is introduced into the chamber for at least two minutes, and the vacuum pump valve is opened and the reaction effluents are evacuated from the chamber.

Processing continues to form, for example, the transistor gate features. A relatively thick layer of silicon dioxide is deposited over the entire surface area, with conventional photolithographic processes used to open contact area features for the source and drain regions.

Next, the wafer is inserted in a process chamber and heated to approximately less than 1000° C. in an atmosphere of reactive gases (such as $H_2$ and HF) for a time period between several milliseconds and five minutes. This step removes any residual native oxide that may be formed during the previous step of creating contact area openings and leaves an atomically clean area—important for quantum doping since this purge exposes the silicon atoms at the surface of the substrate material, as well as their unterminated bonds.

Next, a mixture of suitable silicon-containing source material and buffering gases are introduced into the chamber, and all vales are closed until thermal equilibrium is obtained. At that point, the temperature is rapidly increased and the reagent-limited process of depositing a single layer of silicon atoms takes place. The chamber is again purged, with reaction effluents evacuated therefrom.

At this point, a mixture of suitable silicon-containing source material, buffering gases and dopant-containing source material are introduced and the process parameters controlled to allow for a layer of dopant atoms to chemisorb or react with the previously-deposited silicon atoms. Subsequent to the removal of reaction effluents, one or more layers of silicon atoms are then formed on the layer of dopant atoms, using a series of processing steps as described above.

While the present invention has been described above with respect to a number of different embodiments, the illustrated arrangements are by no means exhaustive of the various types of structures that may be formed using the quantum doping technique of the present invention. It is therefore believed that various other embodiments will now become apparent to those skilled in the art, where these variations are considered to fall within the spirit and scope of the present invention, as defined by the claims appended hereto.

What is claimed is:

1. A method of performing controlled doping of a semiconductor material, the method performed in a reaction chamber and comprising the steps of:
   a) providing a substrate of a semiconductor material of a predetermined crystallographic orientation and having a top major surface;
   b) atomically cleaning the top major surface of the substrate to remove impurities and expose a fixed number of unterminated bonds of surface atoms as controlled by the predetermined crystallographic orientation and surface area of the top major surface, creating a surface with a predetermined atomic surface density defined by the crystallographic orientation and a fixed number of unterminated bonds;
   c) introducing gas precursors of a dopant material at a relatively low temperature, suspending further processing until thermal equilibrium is obtained;
   d) rapidly elevating a temperature within the reaction chamber to a level sufficient to cause atoms of the dopant material to chemisorb with the top surface of the semiconductor material and bond to the fixed number of unterminated bonds in a substitutional bonding formation in a self-limiting deposition process, creating a single layer of dopant atoms of the same atomic surface density and leaving the same, fixed number of unterminated dopant bonds at the surface thereof;
   e) purging the reaction chamber of gas precursor effluent;
   f) introducing gas precursors of substrate material at a relatively low temperature, suspending further processing until thermal equilibrium is obtained;
   g) rapidly elevating a temperature within the reaction chamber to a level sufficient to cause atoms of the substrate material to bond to the fixed number of unterminated dopant bonds in a substitutional bonding formation in a self-limiting deposition process, creating a layer of semiconductor atoms with the same atomic surface density and the same fixed number of unterminated bonds; and
   h) repeating steps e) through g) to continue to deposit additional atomic layers of substrate material sufficient to create a predetermined dopant density, defined by the atomic surface density and the number N of additional atomic layers of substrate material.

2. The method as defined in claim 1 wherein the substrate material is silicon.

3. The method as defined in claim 2 wherein the silicon is oriented along the (100) crystallographic plane and has an atomic surface density of $6.78*10^{14}$ atoms/cm$^2$.

4. The method as defined in claim 1 wherein the dopant material is a material that modifies the conductivity of the semiconductor material.

5. The method as defined in claim 4 wherein the dopant material is a material that introduces a p-type conductivity to the semiconductor material.

6. The method as defined in claim 5 wherein the gas is diborane.

7. The method as defined in claim 4 wherein the dopant material is a material that introduces an n-type conductivity to the semiconductor material.

8. The method as defined in claim 7 wherein a gas precursor selected from the group consisting of arsine and phosphine.

9. The method as defined in claim 1 wherein the dopant material is a material that modifies the mobility of the semiconductor material.

10. The method as defined in claim 9 wherein the semiconductor material is silicon and the dopant material is carbon, forming a graphene structure.

11. The method as defined in claim 2 wherein in performing step b), the semiconductor substrate is exposed to a reactive gas to atomically clean the top major surface.

12. The method as defined in claim 11 wherein gaseous HF is used.

* * * * *